United States Patent [19]

Shinriki et al.

[11] Patent Number: 5,652,180
[45] Date of Patent: Jul. 29, 1997

[54] METHOD OF MANUFACTURING SEMICONDUCTOR DEVICE WITH CONTACT STRUCTURE

[75] Inventors: Hiroshi Shinriki, Chiba; Hiroshi Yamamoto, Tokyo; Nobuyuki Takeyasu, Chiba; Takayuki Komiya, Chiba; Tomohiro Ohta, Chiba, all of Japan

[73] Assignee: Kawasaki Steel Corporation, Kobe, Japan

[21] Appl. No.: 264,928

[22] Filed: Jun. 24, 1994

[30] Foreign Application Priority Data

Jun. 28, 1993 [JP] Japan ................................. 5-157383
Apr. 27, 1994 [JP] Japan ................................. 6-089722

[51] Int. Cl.$^6$ .......................................... H01L 21/285
[52] U.S. Cl. ...................... 437/190; 437/194; 437/195; 437/197; 437/200
[58] Field of Search ........................... 437/200, 194, 437/195, 192, 190, 197, 199

[56] References Cited

U.S. PATENT DOCUMENTS

| | | |
|---|---|---|
| 4,502,210 | 3/1985 | Okumura et al. . |
| 4,701,349 | 10/1987 | Koyanagi et al. ............ 427/228 |
| 4,740,483 | 4/1988 | Tobin . |
| 4,772,571 | 9/1988 | Scovell et al. ............ 437/192 |
| 4,782,380 | 11/1988 | Shankar et al. . |
| 4,784,973 | 11/1988 | Stevens et al. ............ 437/200 |
| 4,871,691 | 10/1989 | Torres et al. ............ 437/200 |

(List continued on next page.)

FOREIGN PATENT DOCUMENTS

| | | |
|---|---|---|
| 1275332 | 10/1990 | Canada . |
| 0097848 | 1/1984 | European Pat. Off. . |
| 0286182 | 10/1988 | European Pat. Off. . |
| 0448276 | 9/1991 | European Pat. Off. . |
| 62-105422 | 5/1987 | Japan . |
| 62-98642 | 5/1987 | Japan . |
| 63-33569 | 2/1988 | Japan . |
| 63-55932 | 3/1988 | Japan . |
| 3-110838 | 5/1991 | Japan . |
| 4-320029 | 11/1992 | Japan . |

OTHER PUBLICATIONS

S. Wolf, "Silicon Processing For the VLSI Era" vol. II, 1990 pp. 116–117, 121–123, 128–133, 164–167, 238–239, 251–255.

Y.H. Ku et al., Appl. Phys. Lett., 50, 22 (1987) 1598 "Stable, Self Aligned TiN$_x$O$_y$/TiSi$_2$ contact . . . ".

Y.H. Ku et al., Thin Solid Films, 172 (1989) "Self Aligned TiN$_x$O$_y$/TiSi$_2$ contact formation".

H. Kaneko et al., IEEE Trans. Electron Dev., 33,11 (1986) 1702 "Self Aligned Nitridation of Silicide (Sanicide)".

(List continued on next page.)

*Primary Examiner*—Charles L. Bowers, Jr.
*Assistant Examiner*—Leon Radomsky
*Attorney, Agent, or Firm*—Oliff & Berridge

[57] ABSTRACT

A semiconductor device with a contact structure includes a silicon substrate, a diffusion region formed in a surface of the silicon substrate, a silicide film of high melting point metal deposited on the diffusion region, an insulating film formed on the silicon substrate, a contact hole formed in the insulating film such that the silicide film is exposed at a bottom of the contact hole, an anti-diffusion film formed on the exposed surface of the silicide film at the bottom of the contact film, a plug formed in the contact hole by a selective Al CVD, and a metal wiring formed on the insulating film such that the metal wiring is electrically connected to the diffusion region by means of the plug, anti-diffusion film and silicide film. The anti-diffusion film may be formed by nitriding the surface of the silicide film.

25 Claims, 20 Drawing Sheets

U.S. PATENT DOCUMENTS

| | | |
|---|---|---|
| 4,904,620 | 2/1990 | Schmitz . |
| 4,944,836 | 7/1990 | Beyer et al. . |
| 5,008,217 | 4/1991 | Case et al. ............................... 437/195 |
| 5,043,300 | 8/1991 | Nulman ................................... 437/200 |
| 5,104,694 | 4/1992 | Saito et al. ............................... 427/255 |
| 5,141,897 | 8/1992 | Manocha et al. . |
| 5,187,120 | 2/1993 | Wang . |
| 5,200,639 | 4/1993 | Isuizuka et al. ......................... 257/508 |
| 5,209,816 | 5/1993 | Yu et al. . |
| 5,217,756 | 6/1993 | Shinzawa ................................ 427/252 |
| 5,231,056 | 7/1993 | Sandhu ................................... 437/200 |
| 5,270,254 | 12/1993 | Chen et al. .............................. 437/190 |
| 5,272,666 | 12/1993 | Tsang et al. . |
| 5,273,755 | 12/1993 | Dyer et al. ............................... 427/252 |
| 5,288,665 | 2/1994 | Nulman . |
| 5,344,792 | 9/1994 | Sandhu et al. .......................... 437/200 |

OTHER PUBLICATIONS

B.–Z. Li et al., J. Vac. Sci. Tehnol., B5,6 (1987) 1667 "Self Aligned TiSi . . . By $NH_3$ Plasma Assisted . . . ".

"Formation of Texture Controlled Aluminum and Its Migration Performance In Al–Si/TiN Stacked Structure", M. Kageyama et al., 1991, pp. 97–101, IEEE/IRPS.

"CVD Aluminum For Submicron VLSI Metallization", W.Y.–C. Lai et al., VMIC Conference, Jun. 11–12, 1991, pp. 89–95.

"Improvement of the Interface between Selectively Deposited A1 and Si by Annealing", K. Tani et al., Extended Abstracts of the 1993 International Conference on Solid State Devices and Materials, Makuhari, 1993, pp. 543–545.

"Characterization of LPCVD Aluminum for VLSI Processing", R.A. Levey et al., J. Chemical Soc., Solid State Science and Technology, Sep. 1984, pp. 2175–2182.

"Selective Aluminum Chemical Vapor Deposition", K. Tsubouchi et al., Journal of Vacuum Science and Technology: Part A., vol. 10, No. 4, Jul. 1992, New York US pp. 856–862.

"Using Transition Metal Conducting Oxides to Prevent Conductivity Degradation of Submicron Wiring at High Temperatures", IBM Technical Disclosure Bulletin, vo. 31, No. 2, Jul. 1988, New York US pp. 16–18 (p. 17, paragraph 2 —p. 18, paragraph 3).

"Use of Chem–Mech Polishing To Enhance Selective CVD–W", IBM Technical Disclosure Bulletin., vol. 34, No. 7B, Dec. 1991, New York US p.87 (The Whole Document).

"The Use of $TISI_2$ For Self Aligned Silicide (Salicide) Technology", Ting et al., Jun. 25–26, 1985, V–MIC Conf., pp. 307–318.

"A Novel Double–Self–Aligned Tisi2/T1N Contact With Selective CVD W Plug For Submicron Device and Interconnect Applications", Wang et al., pp. 41–42.

"Improvement of the Interface between Selectively Deposited Al and Si by Annealing", Tani et al., Extended Abstracts of the 1993 International Conference on Solid State Devices and Materials, Makuhari, 1993, pp. 543–545.

"Planarized Aluminum Metallization for Sub–0.5 um CMOS Technology", Chen et al., IEEE, 1990, pp. 3.4.1–3.4.4 IEDM 90.

"The Properties of Al–Cu/Ti Films sputter Deposited at Elevated Temperatures and High DC Bias", Hariu et al., 1989, pp. 210–214.

"High–Performance CMOS for Oxidation–Planarized Twin Tubs and One–Mask Sealed Diffusion–Junctions", Liu et al., 1993 IEEE, pp. 17.2.1–17.3.1 IEDM 93.

"A Low Parasitic Capacitance Scheme by Thermally Stable Titanium Silicide Technology for High Speed CMOS", Yoshida et al., Extended Abstracts of the 1993 International Conf. on Solid State Devices and Materials, Makuhari, 1993, pp. 567–569.

"Selective Growth of Aluminum Using a Novel CVD System", Amazawa et al., 442–IEDM, 1988 IEEE, pp. 442–445.

"Novel self–aligned W/TiN/$TiSi_2$ contact structure for very shallow junctions and interconnections", Joshi et al., Appl. Phys. Lett.54(17) 24 Apr. 1989, pp. 1672–1674.

"Selective Titanium Silicide Chemical Vapor Deposition with Surface Cleaning by Silane and Ohmic Contact Formation to Very Shallow Junction", Saito et al., J. Electrochem. Soc., vol. 140, No. 2, Feb. 1993, pp. 513–518.

T. Kikkawa et al., IEEE Trans. Electron Dev., 40(2)(1993)296, "A quarter–micron interconnection . . . TiN/Al–Si–Cu/TiN/Al–Ci–Cu/TiN/Ti multilayer structure", Feb. 1993.

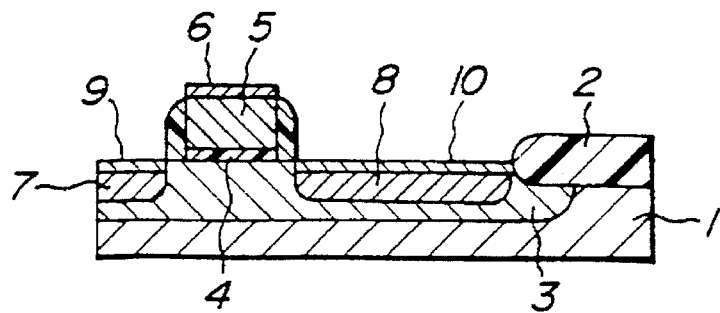
FIG_1A
PRIOR ART
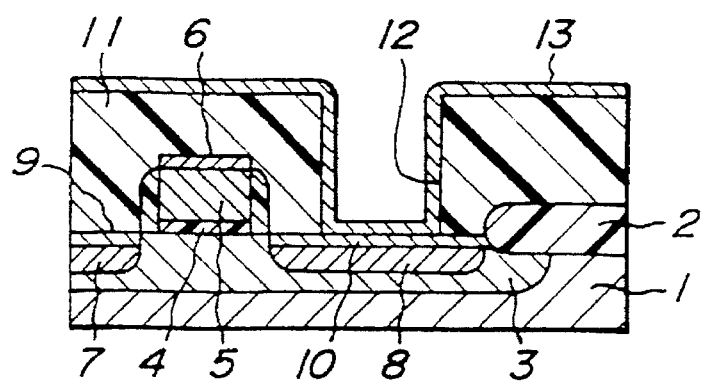
FIG_1B
PRIOR ART
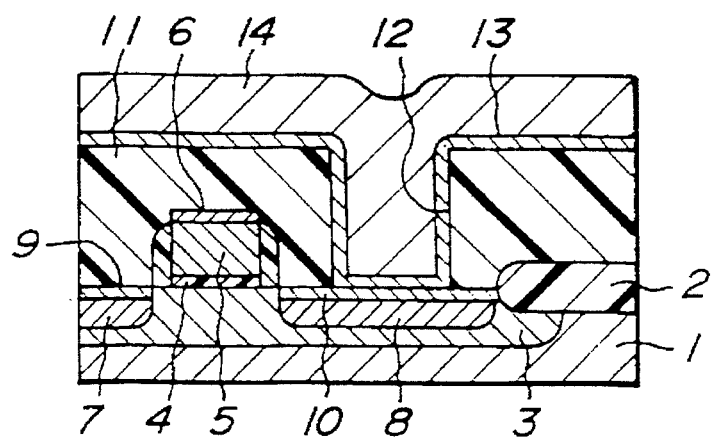
FIG_1C
PRIOR ART
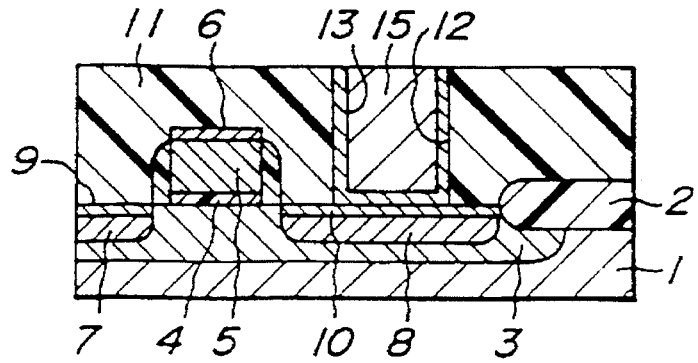
FIG_1D
PRIOR ART

FIG_2
PRIOR ART
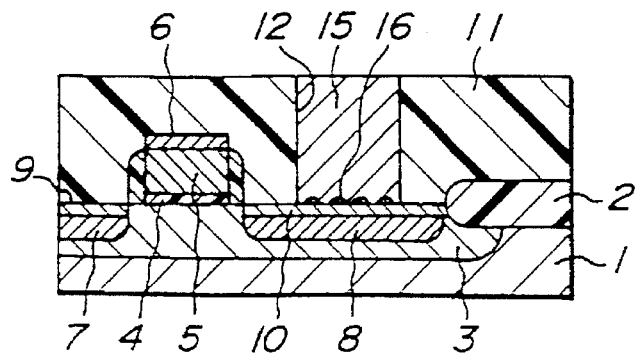
FIG_3A
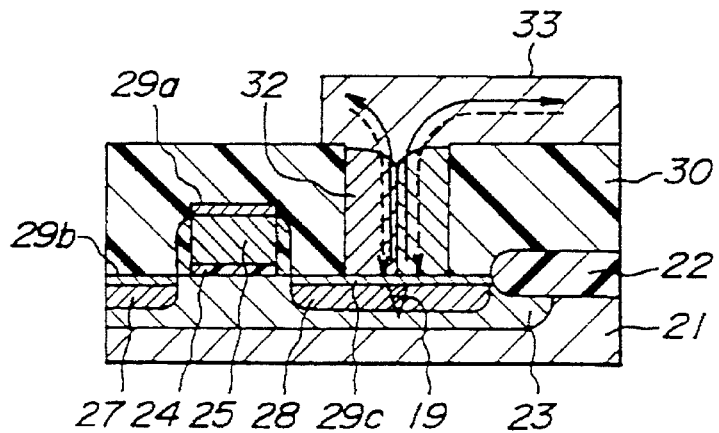
FIG_3B
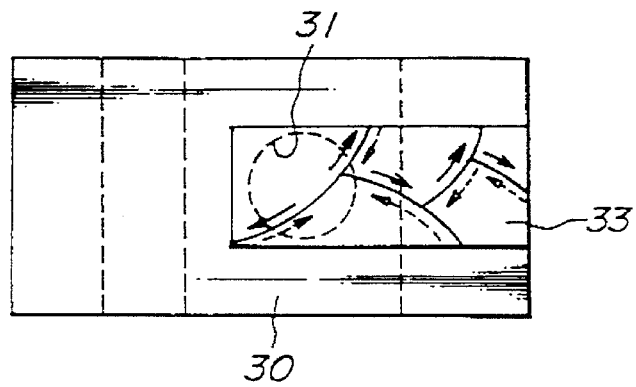

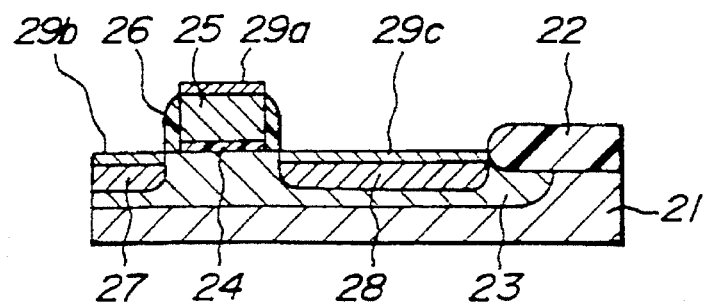
FIG_4A
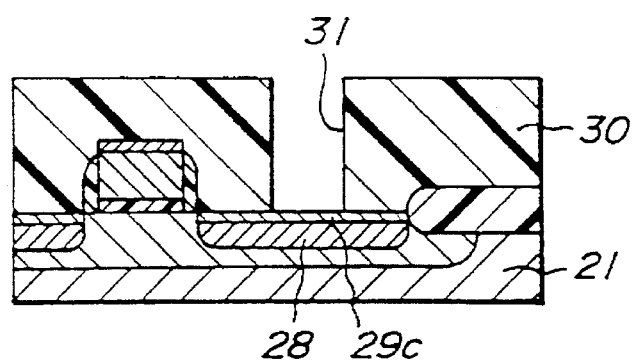
FIG_4B
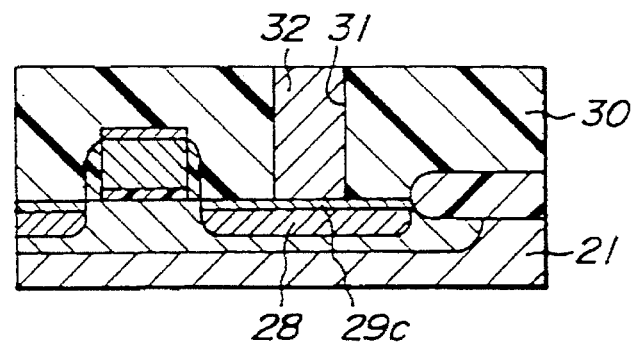
FIG_4C
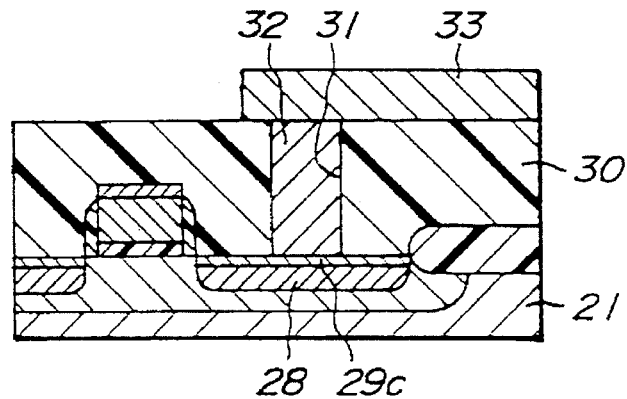
FIG_4D

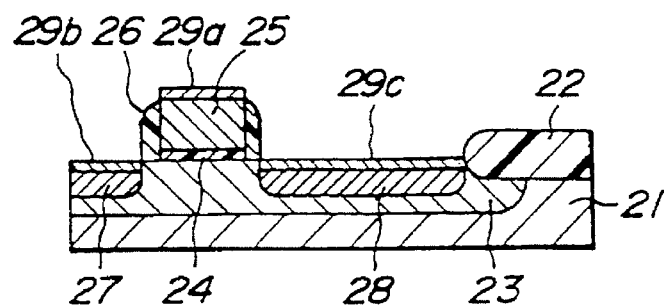
FIG._7A
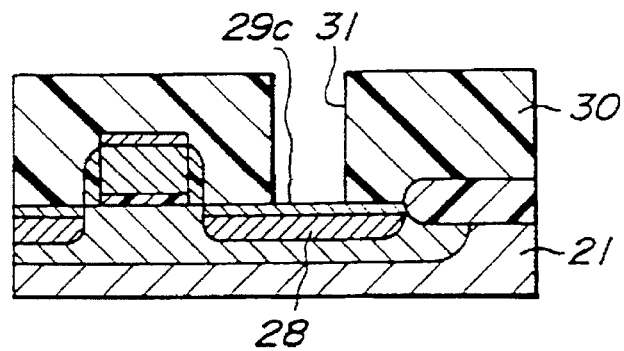
FIG._7B
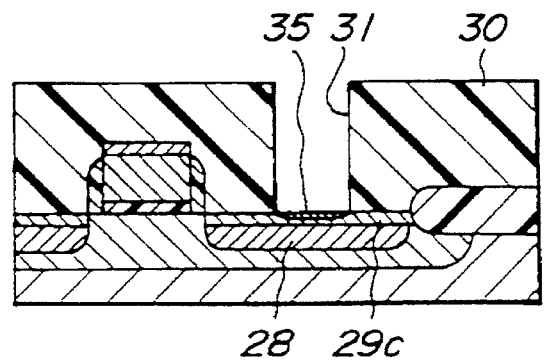
FIG._7C
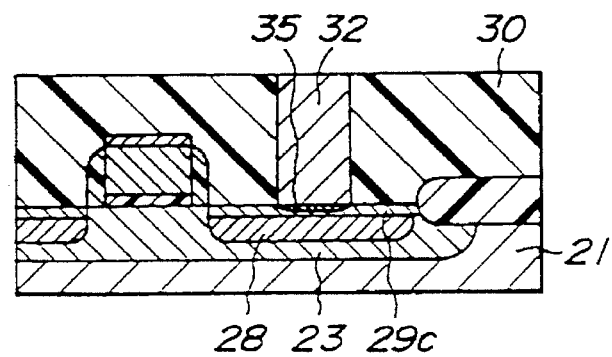
FIG._7D

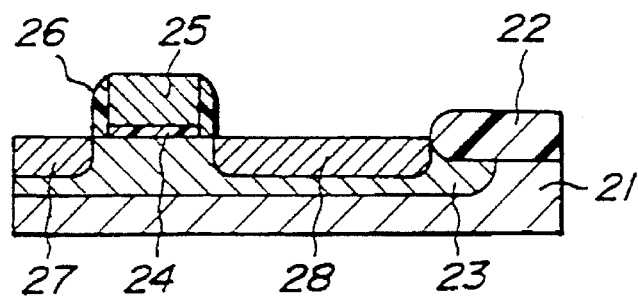
FIG_8A
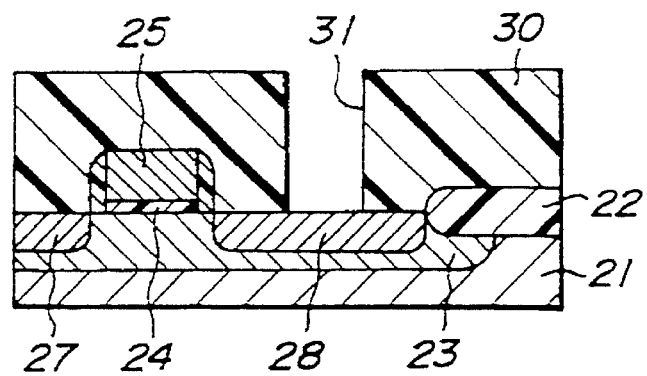
FIG_8B
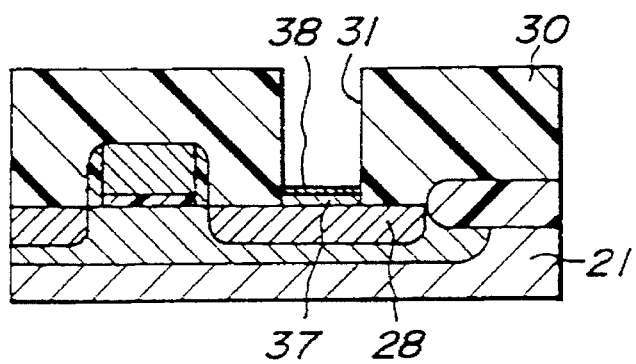
FIG_8C
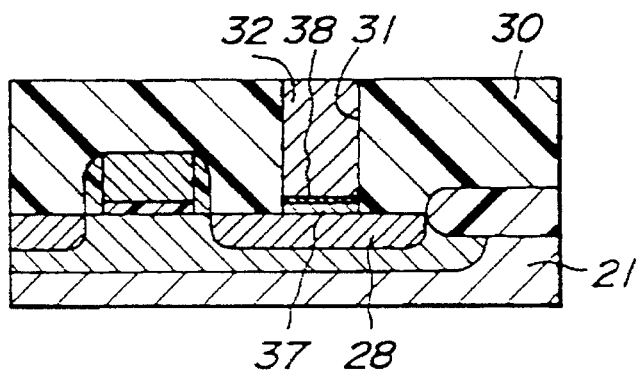
FIG_8D

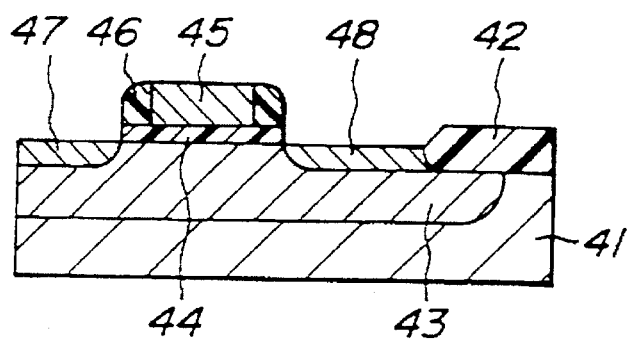
FIG_9A
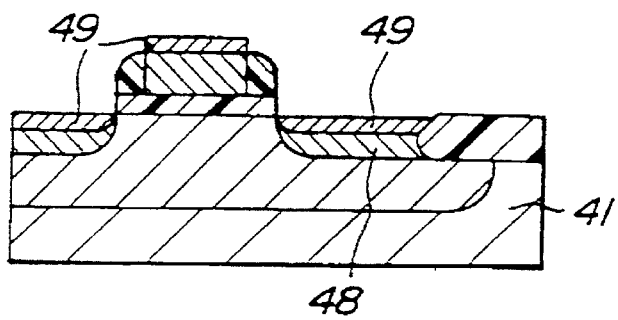
FIG_9B
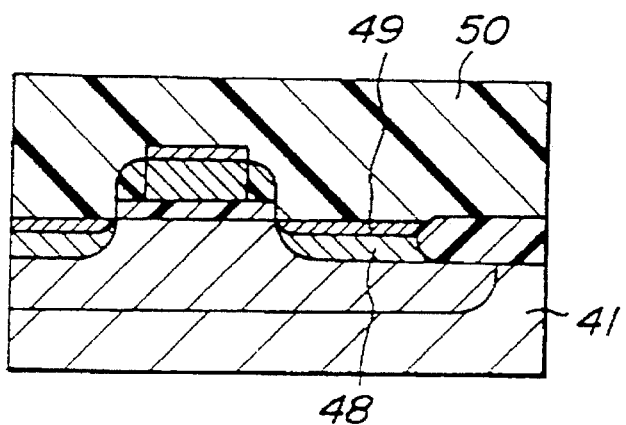
FIG_9C
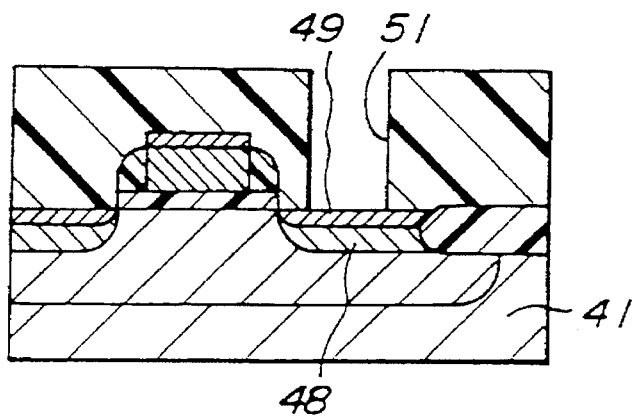
FIG_9D

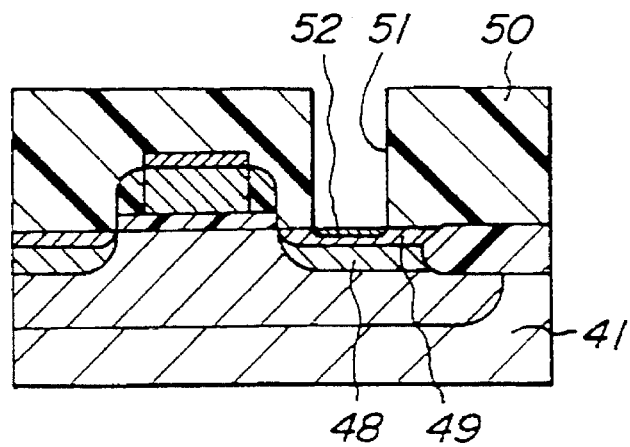
FIG_9E
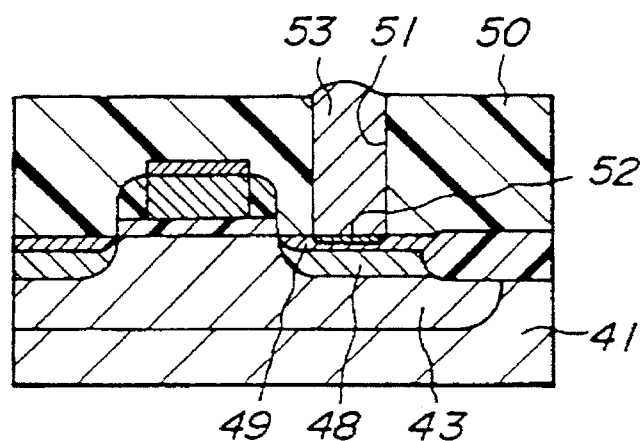
FIG_9F
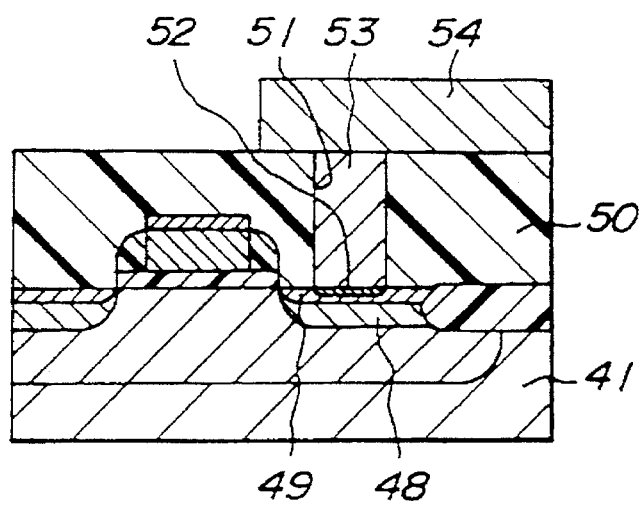
FIG_9G

FIG_10
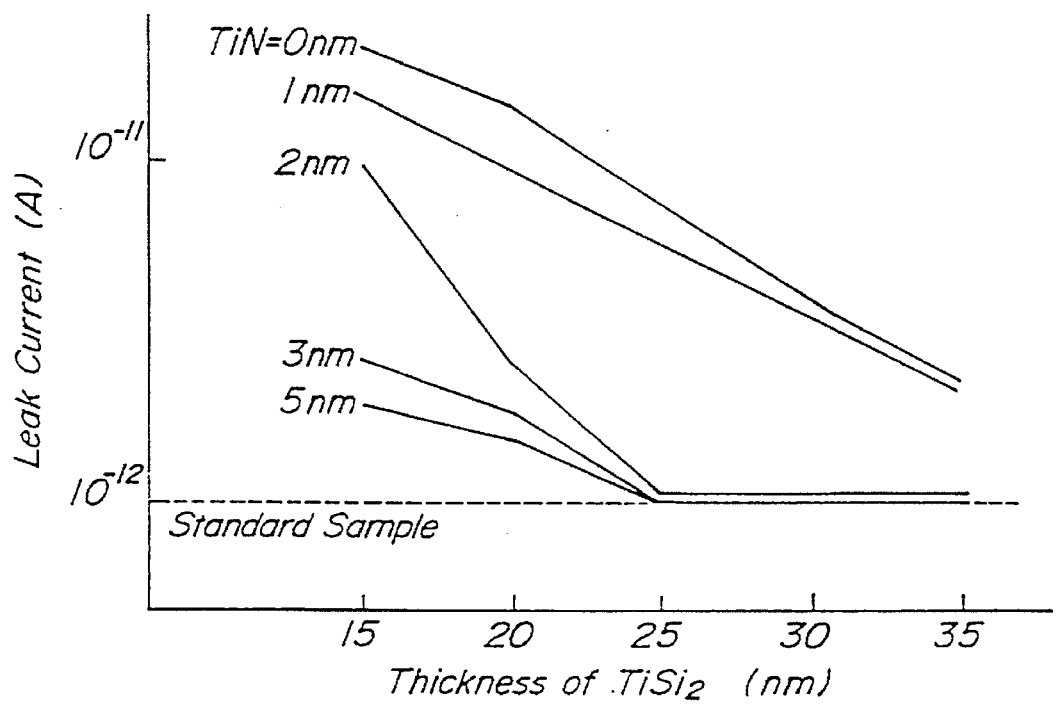
FIG_11
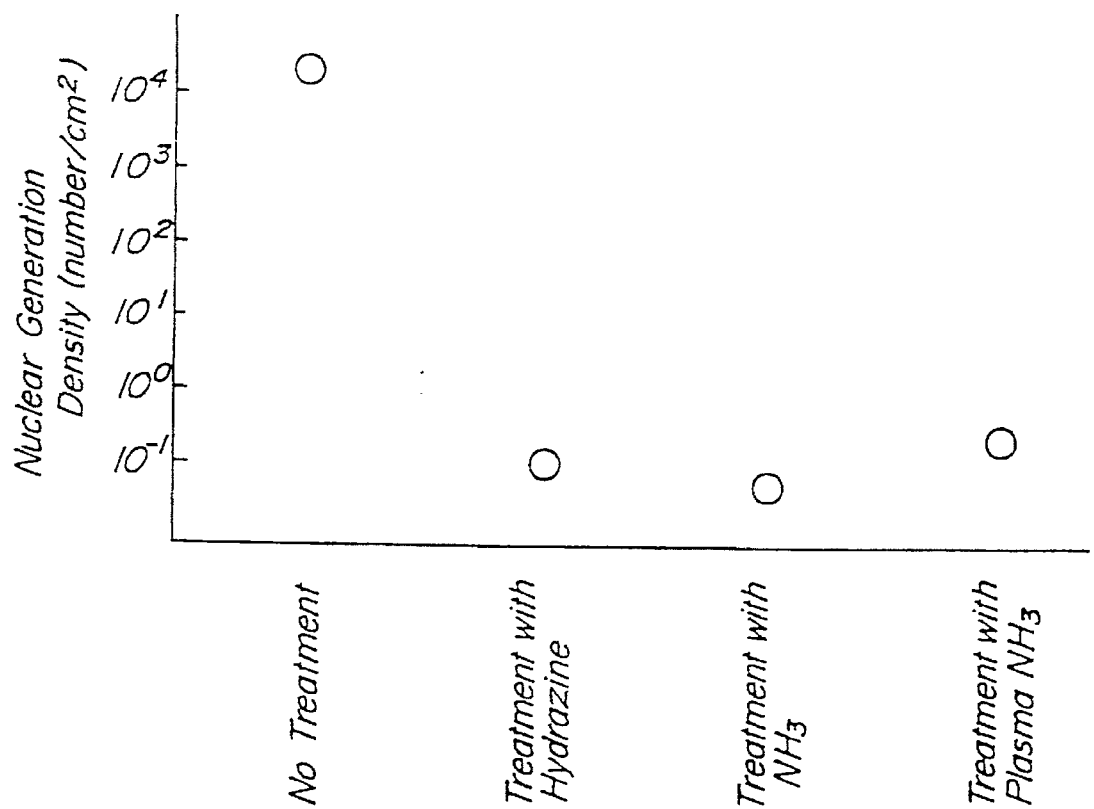

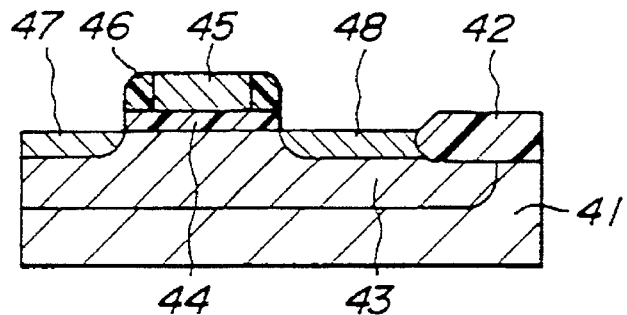
FIG_12A
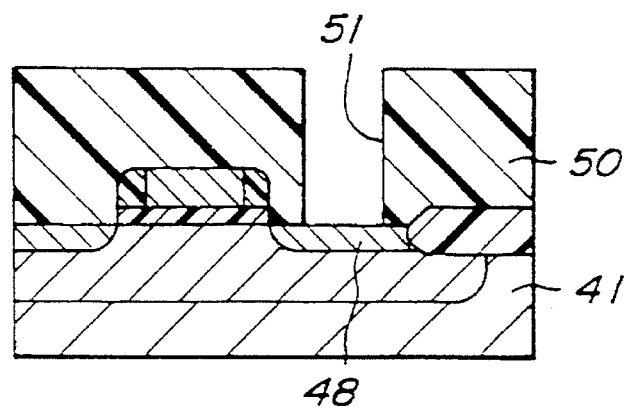
FIG_12B
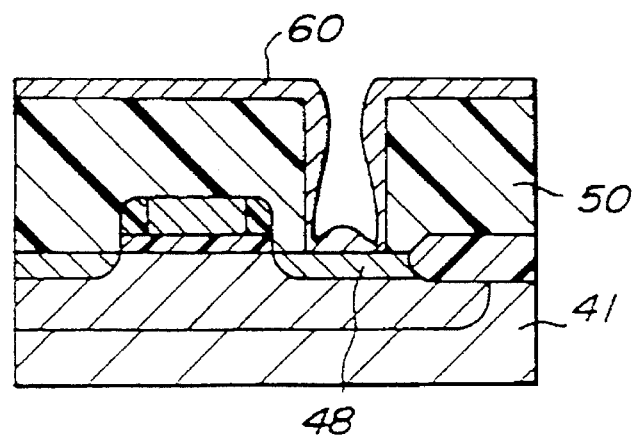
FIG_12C
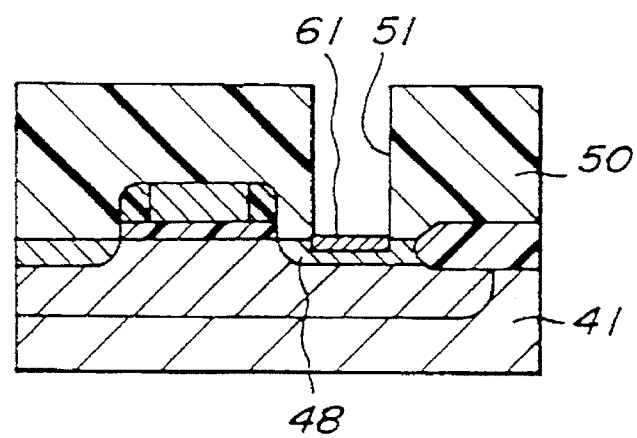
FIG_12D

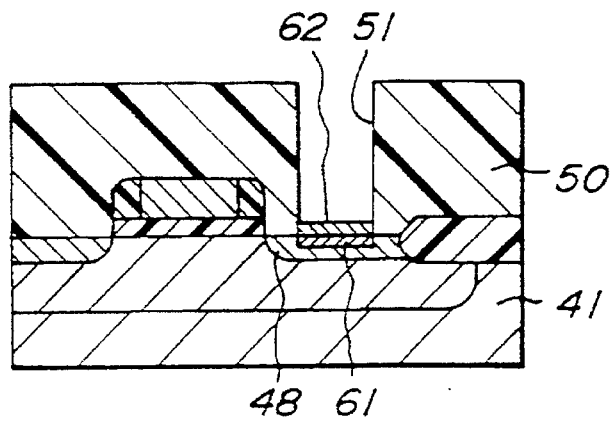
FIG._12E
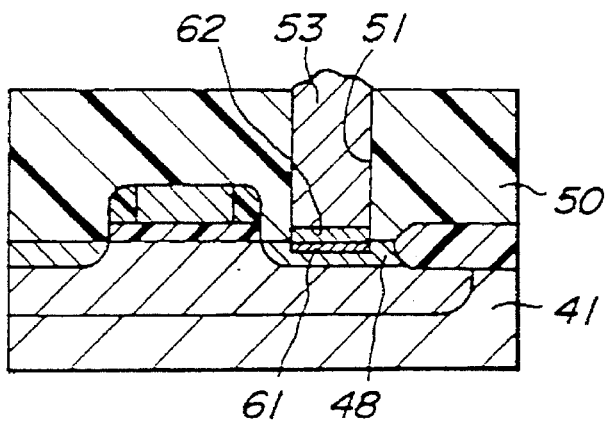
FIG._12F
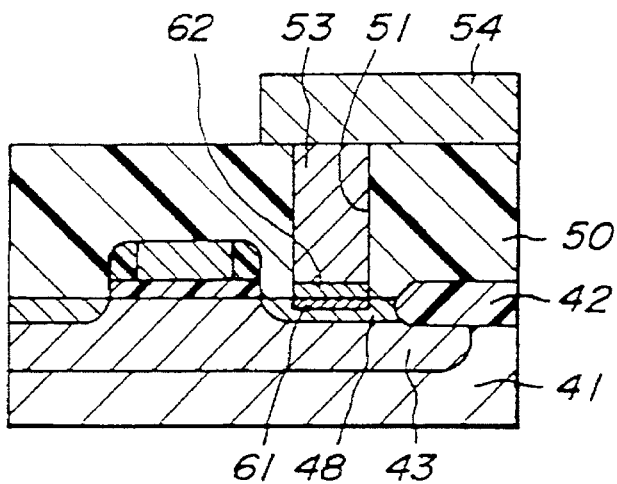
FIG._12G

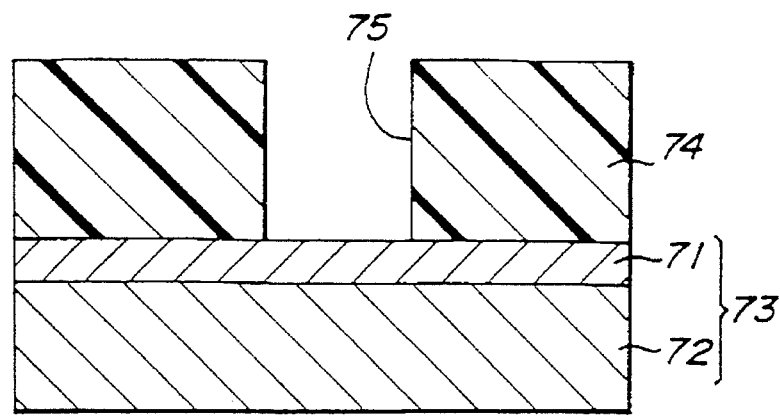
FIG_13A
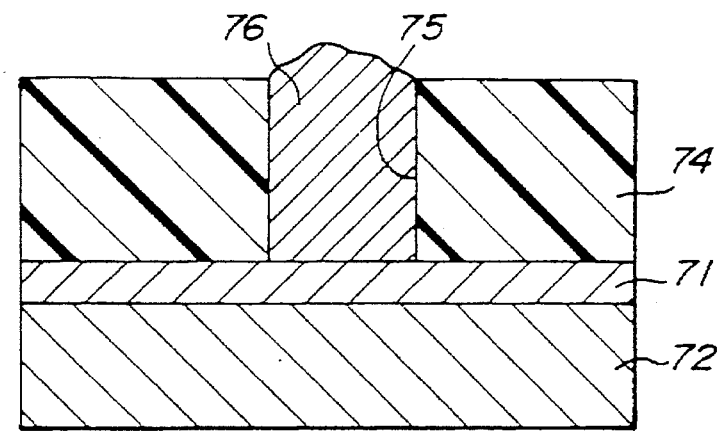
FIG_13B
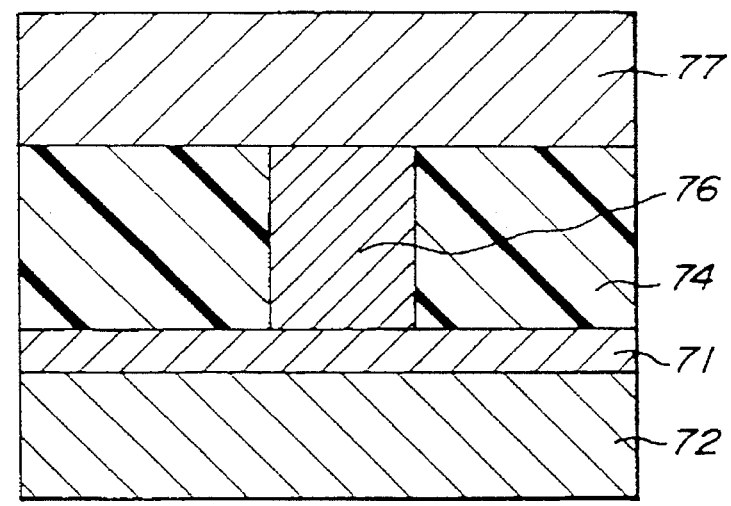
FIG_13C

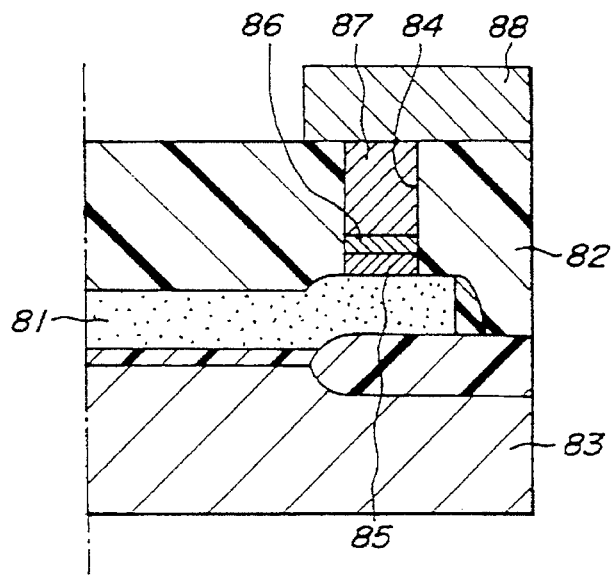
FIG._14
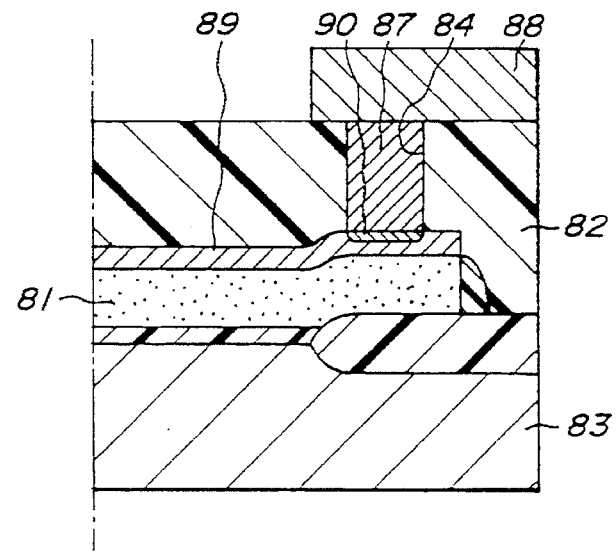
FIG._15
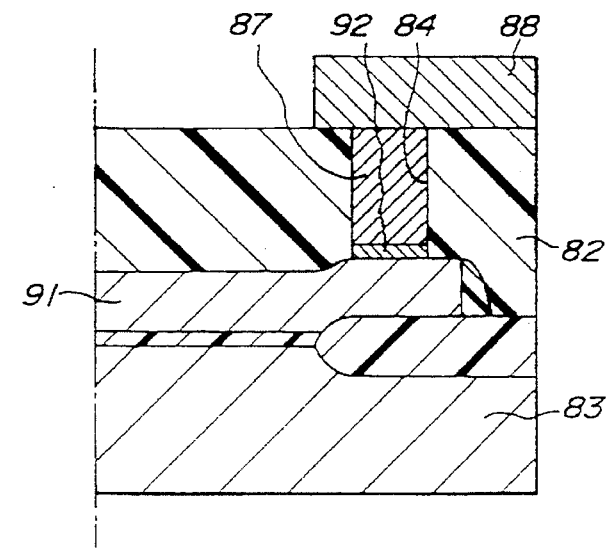
FIG._16

FIG_17A
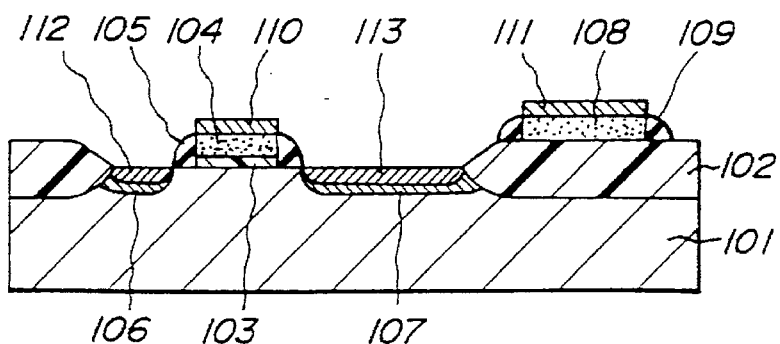
FIG_17B
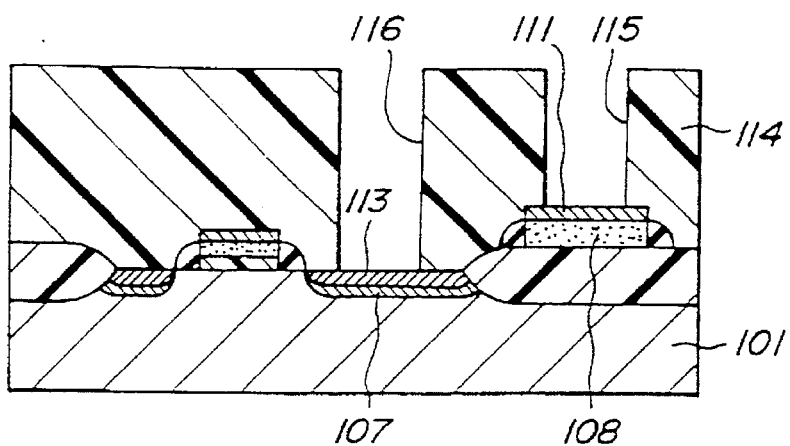
FIG_17C
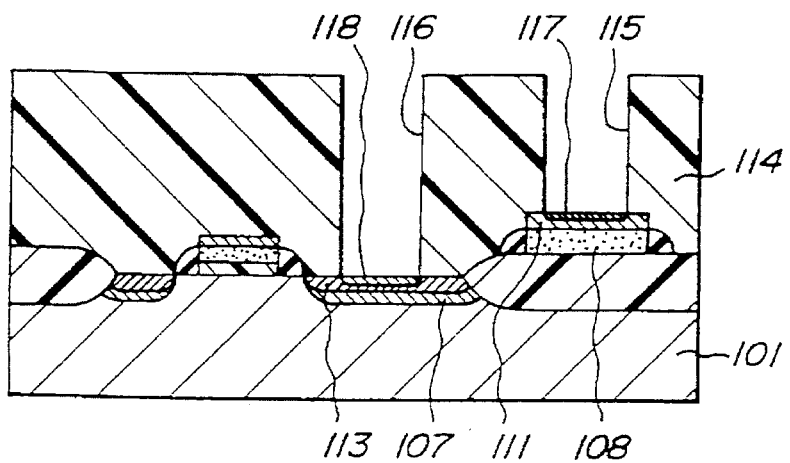

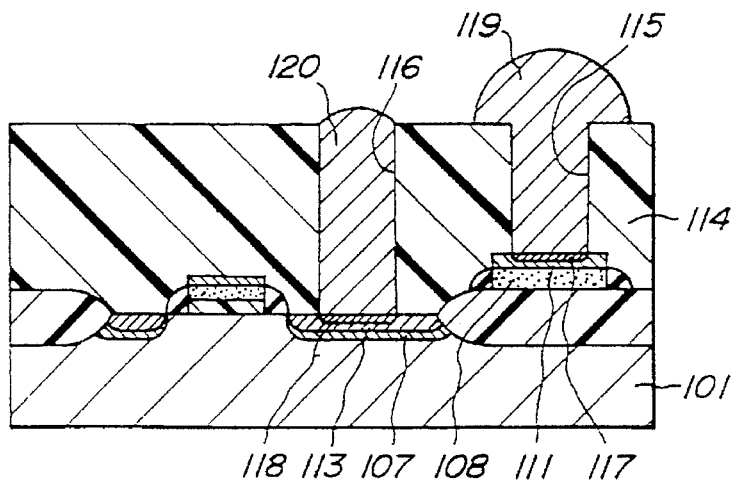
FIG_17D
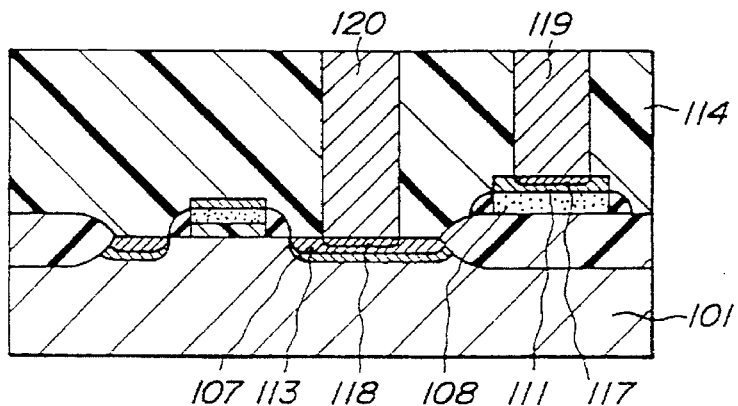
FIG_17E
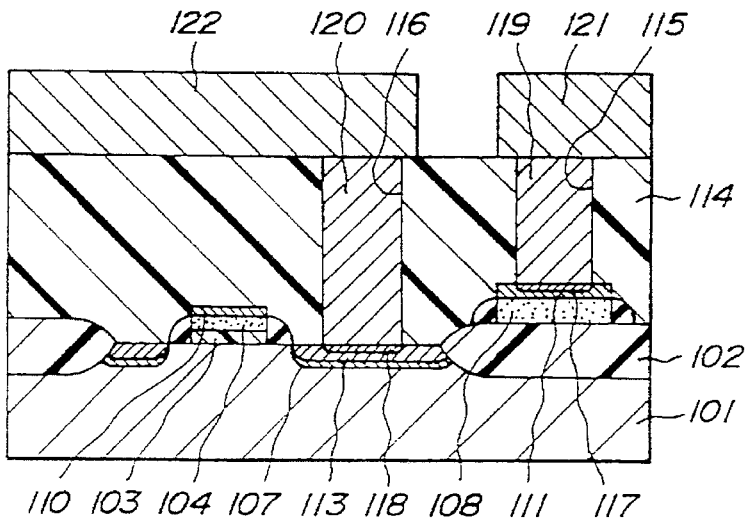
FIG_17F

FIG_18D
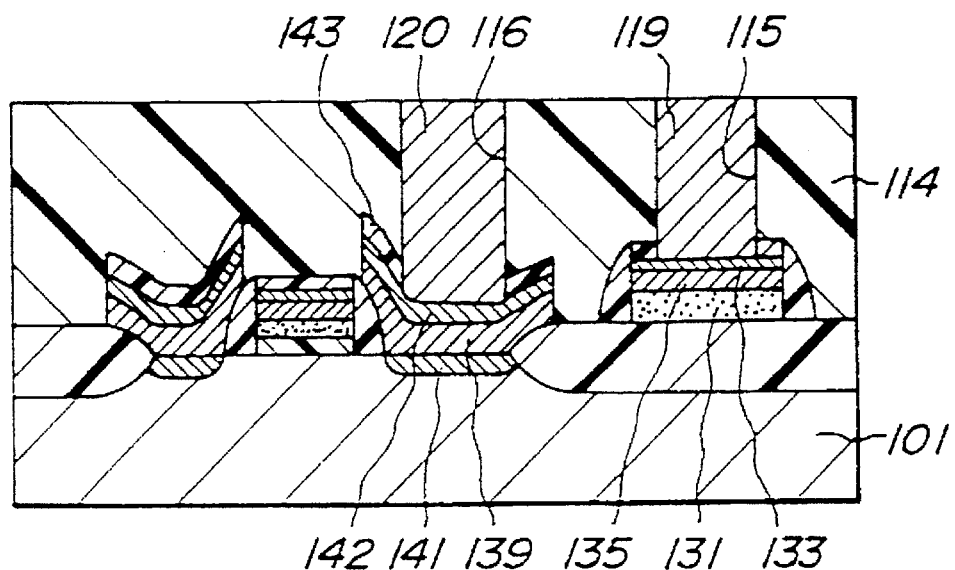
FIG_18E
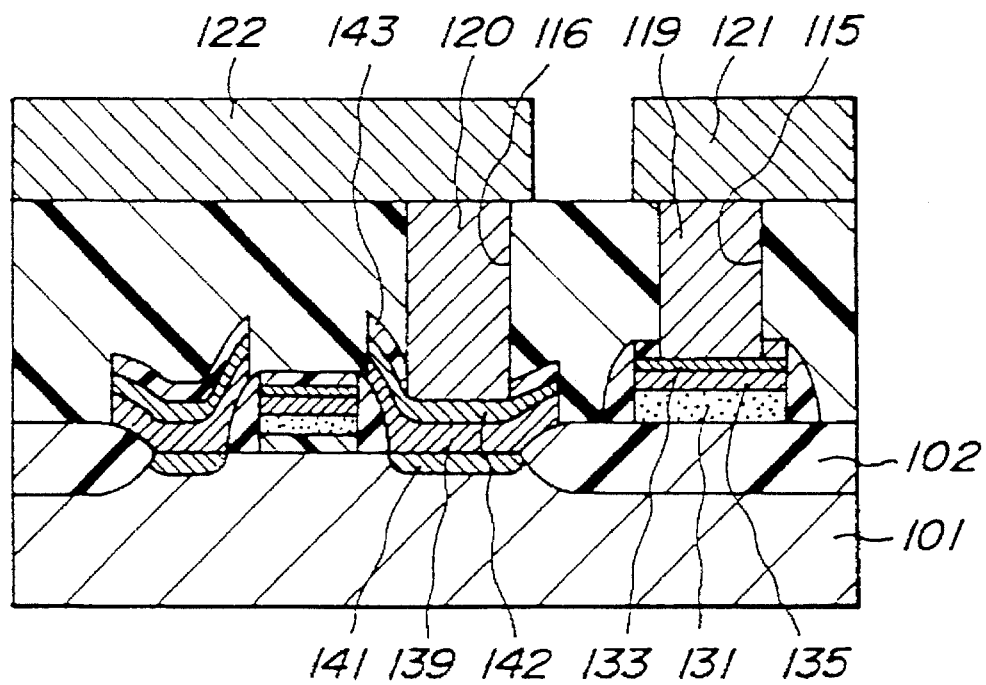

FIG_19A
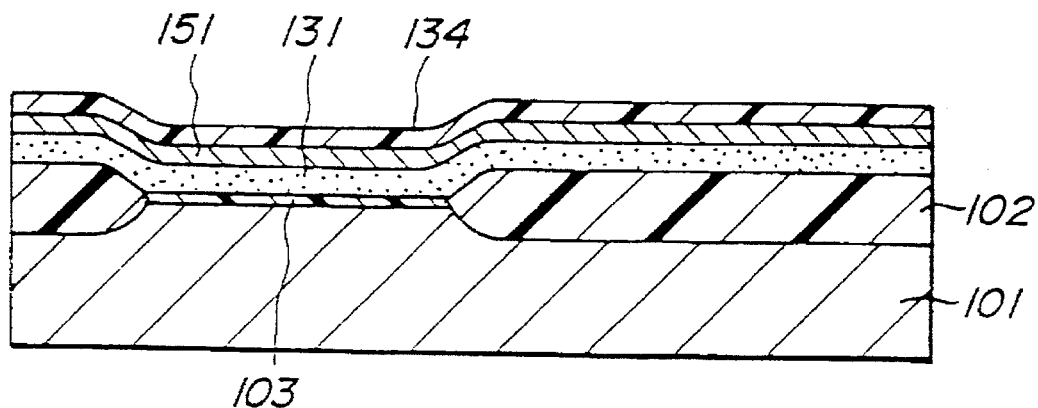
FIG_19B
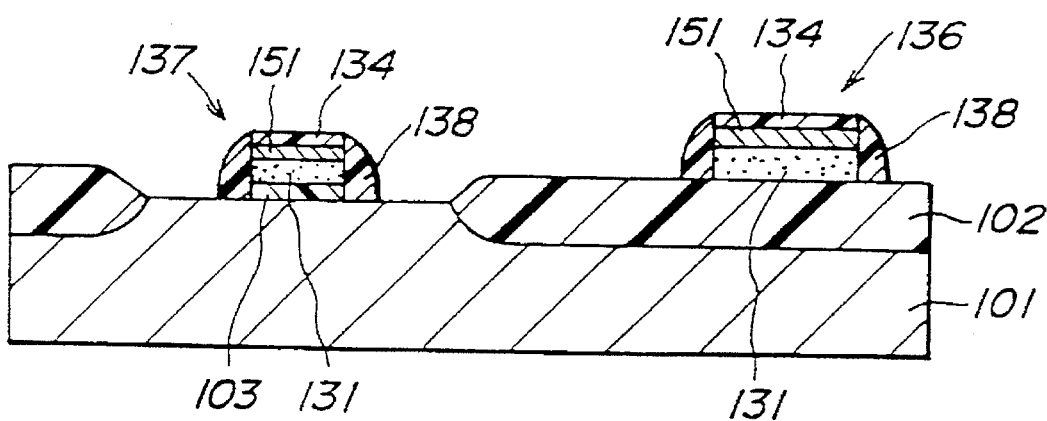
FIG_19C
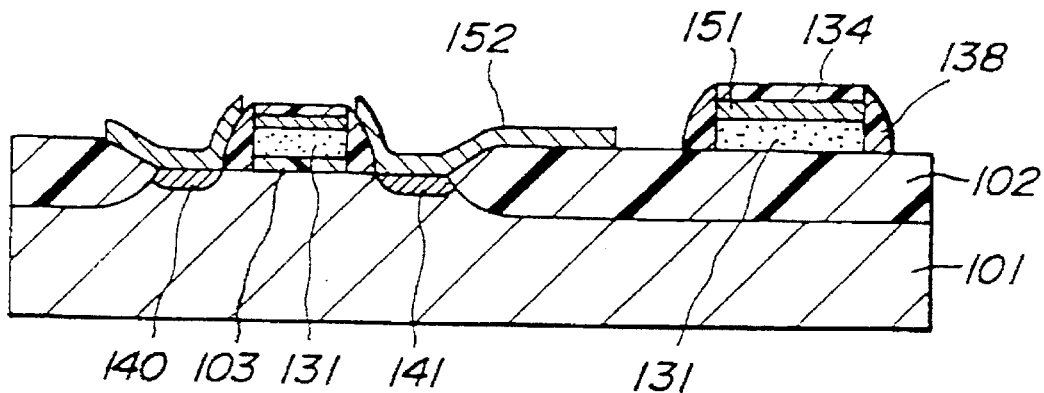

FIG_19D
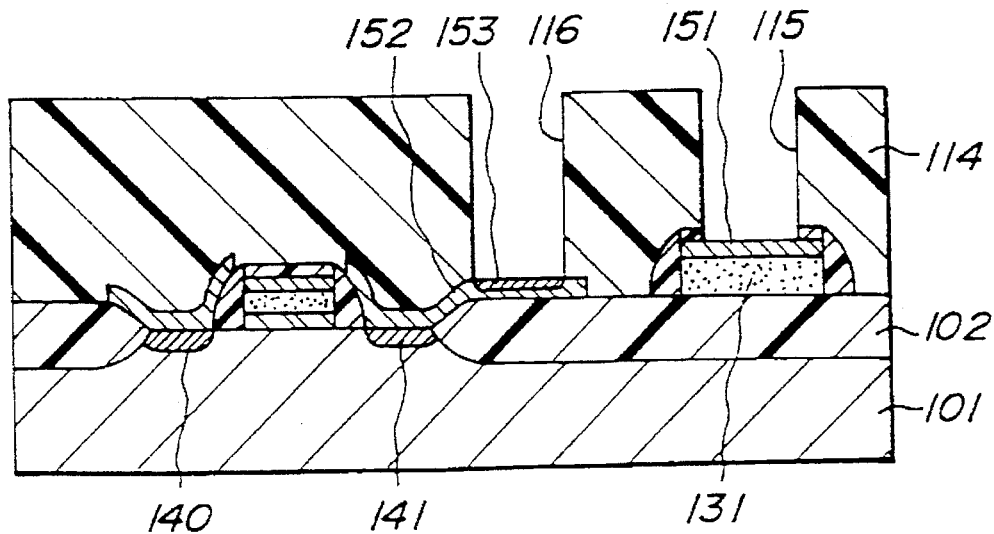
FIG_19E
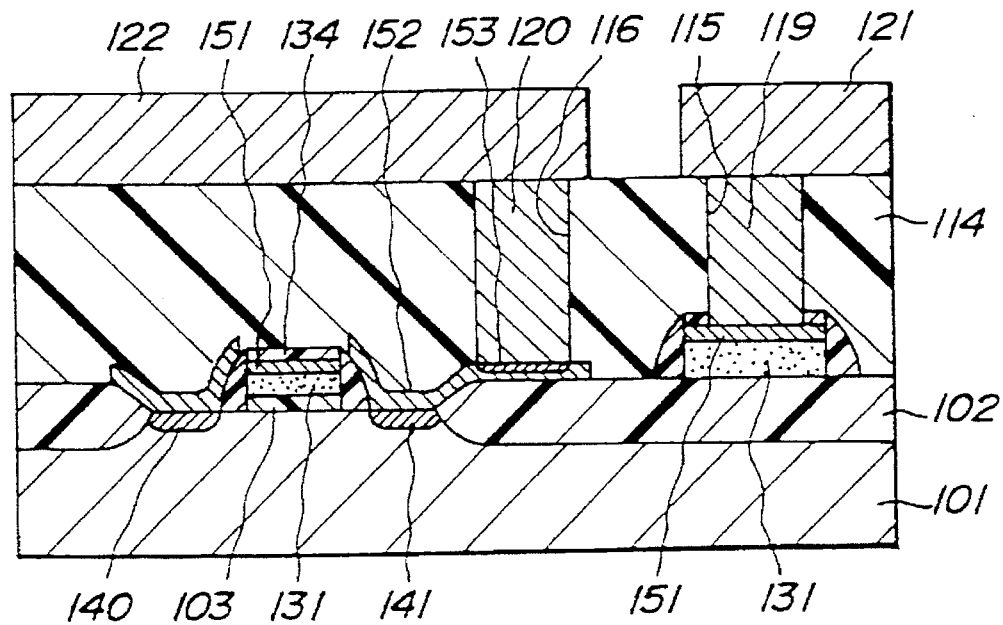

METHOD OF MANUFACTURING SEMICONDUCTOR DEVICE WITH CONTACT STRUCTURE

BACKGROUND OF THE INVENTION

1. Field of the Invention

The present invention relates to a semiconductor device with a contact structure for connecting a conductive region formed on at least one of junction and gate insulating film such as diffusion region and gate electrode of the semiconductor device to a metal wiring, and also relates to a method of manufacturing a semiconductor device including such a contact structure.

2. Description of the Related Art

In a semiconductor device including MOSFET transistors, source and drain regions of these transistors are connected to metal wirings by means of contact structures. In a known semiconductor device, a contact structure is formed by the following steps. At first, an insulating film such as an interlayer insulating film, i.e. $SiO_2$ film is formed on a silicon substrate having a surface in which transistor regions are formed, and then the insulating film is selectively removed to form a contact hole. Next, Ti film, TiN film and Al film are successively deposited by sputtering on the surface of the insulating film as well as in the contact hole, and after that a multilayered metal film on the insulating film is selectively removed in accordance with a desired pattern to form metal wirings. In this known contact structure, the Ti film reacts with silicon atoms of the diffusion region during a heating process after the deposition to form a silicide which serves to decrease a contact resistance between the diffusion region and the metal wiring. The TiN film serves to prevent the mutual movement of the silicon atoms and metal atoms of the metal wiring, so that a junction formed between the diffusion region and a bulk of the silicon substrate or a well formed in the surface of the silicon substrate can be protected against breakage. That is to say, the TiN film serves as an anti-diffusion film. The Al film constitutes a main body of the metal wiring and serves to flow an electric current at a low resistance.

However, in a usual sputtering method, it is rather difficult to deposit an aluminum alloy film within a fine contact hole. Therefore, upon manufacturing a semiconductor device including contact holes having a diameter smaller than about 0.8 µm, a metal film is not deposited simultaneously on the insulating film as well as in the contact holes, but at first metal plugs are formed within the contact holes and then a metal wiring film is deposited on the insulating film as well as on the plugs.

Heretofore, source and drain regions of MOS transistors are formed by diffusion regions having impurities such as As and B diffused therein. In recent MOS transistors, it has been required to make a gate length shorter than about 0.5 µm, and then a resistance of the diffusion regions becomes comparable to a channel resistance. Therefore, particularly in a high speed logic integrated circuits, a silicide of a high melting point metal such as $TiSi_2$ is formed on a diffusion region in order to decrease the resistance of the source and drain regions.

FIGS. 1A to 1D are cross sectional views showing successive steps of manufacturing a MOS transistor in which a silicide of high melting point metal is used.

As shown in FIG. 1A, on a surface of a silicon substrate or wafer 1 wells 3 are formed such that they are isolated by the field oxide film 2. A MOS FET is formed in a well 3. A gate of MOS FET is formed by a gate insulating film 4 such as oxide and nitrided oxide film, highly doped polysilicon film 5 and silicide film 6 such as $TiSi_2$. On both sides of the gate, there are formed source region 7 and drain region 8. On surfaces of the source and drain regions 7 and 8, there are formed silicide films 9 and 10. The silicide films 6, 9 and 10 may be formed by a known salicide method which is described in, for instance "C. Y. Ting et al, 2nd International IEEE VLSI Multilevel Interconnection Conference", (1985) p. 307.

Next, as illustrated in FIG. 1B, an insulating layer 11 is formed on the silicon substrate 1, and a contact hole 12 is formed therein by selectively removing the insulating layer. Then, a metal composite film 13 is deposited on the insulating film as well as on an inner surface of the contact hole 12 by depositing thin Ti film and TiN film successively in this order. Then, a tungsten (W) film 14 is deposited on the whole surface of the substrate by means of a chemical vapor deposition (CVD) using a hexafluoro tungsten ($WF_6$) gas as a raw material gas as shown in FIG. 1C. During this CVD process, the metal film 13 serves as an adhering film. Then, the tungsten film 14 is etched back to form a plug 15 embedded in the contact hole 12 as depicted in FIG. 1D. Finally, a metal film is formed on the insulating film 11 such that it is connected with the tungsten plug 15, and the metal film is patterned into a desired metal wiring.

In the known method of manufacturing the contact structure including the plug, after the Ti/TiN film 13 is formed on the insulating film 11, the tungsten film 14 is deposited thereon while the Ti/TiN film is used as the adhering film, and then the tungsten film 14 is etched back to form the plug 15 within the contact hole 12. It is apparent that this known method is rather complicated. Further, if the contact hole 12 is formed to have a reversed taper shape, during the formation of the tungsten film 14, a seem or void is liable to be formed within the contact hole 12. Then, it is no more possible to obtain a good electrical contact and a reliability of MOSFET is decreased. Moreover, when the tungsten film is formed from the $WF_6$ gas, it contains a large amount of fluorine. It should be noted that fluorine is very corrosive, so that the metal wiring is damaged and the transistor characteristics are degraded.

It has been further proposed to form a plug within the contact hole by means of a selective CVD as shown in FIG. 2. In this selective CVD, a $W_6$ gas is flowed along the surface of the substrate and a tungsten film is selectively deposited in the contact hole 12 where the titanium silicide film 10 is exposed at its bottom. In this method, the contact hole 12 can be completely filled with tungsten and no seem or voids is formed in the tungsten film. However, even in this method, a large amount of fluorine is contained in the tungsten plug 15. Moreover, the fluoro series gas flowing along the surface of the substrate is reacted with the titanium silicide film 10 to form particles of $TiF_3$ 16 on the surface of the titanium silicide film 10. These $TiF_3$ particles 16 at a boundary between the plug 15 and the silicide film 10 increase the contact resistance.

In order to mitigate the above mentioned drawback, it has been also proposed to perform the selective CVD of tungsten after converting the surface of the titanium silicide film 10 which is exposed at the contact hole 12, into a TiN film by using a nitriding treatment. This method has been described in "VLSI Technology Symposium", Martin S. Wang et al, 1991, p. 41. However, this method could not solve the problem of the corrosion and degradation of property due to fluorine.

In Japanese Patent Application Laid-open Publication Kokai Hei 3-110838, there is proposed another method of forming a contact plug by means of a selective CVD using a raw material gas containing aluminum. A similar method has been also described by Kouichi Tani and Satoshi Nishikawa (OKI) in Extended Abstracts 1993, International Conference of SSDM, p. 543 (1993). In these publications, aluminum plug is formed directly on the surface of the silicon substrate. However, as shown by Tani and Mishikawa, surface of the silicon substrate is eroded by aluminum during CVD and the junction characteristics are degraded. By now, no publication about the formation of aluminum plug by selective CVD on silicide film formed by salicide method is available.

In the selective CVD of aluminum, aluminum has to be deposited not on the insulating film but only in the contact hole. However, in practice, aluminum is liable to be deposited on the insulating film as well as on the side wall of the contact hole due to the dangling bonds existing on the surface of the insulating film. Therefore, a void might be formed within the aluminum plug. Moreover, the aluminum deposited on the insulating film might short-circuit the metal wirings.

It has been further proposed to form the $TiSi_2$ film by means of CVD using $TiCl_4$ gas and $SiH_4$ gas. However, this CVD process is difficult to be controlled and silicon atoms might be sucked from the diffusion layer into the $TiSi_x$ film so that the contact property is deteriorated, and at the same time an excess amount of silicon atoms supplied from the $SiH_4$ gas are remained within the $TiSi_x$ gas so that the contact resistance might be increased. Particularly, when a thick film is to be deposited, it is very difficult to avoid these drawbacks, so that the contact hole could not be actually filled only with the $TiSi_2$ film.

It has been further proposed to heat the substrate at a temperature above 450° C. during the deposition of the aluminum alloy film by sputtering such that aluminum alloy is flowed into the contact hole. This method is disclosed in "T. Hariu et al, 1989 International Reliability Physics Symposium", p. 200 and Chen et al, 1990 International Electron Device Meeting, P. 51. However, this known method also requires the Ti/TiN metal film in order to make the aluminum alloy film be able to flow into the contact hole like as the method in which the plug is formed by depositing the tungsten film all over the substrate surface. The Ti/TiN metal film is also required to decrease the contact resistance and to avoid the degradation of the junction due to the temperatures during the deposition of the aluminum alloy film. Moreover, this method can be effectively applied only to the contact hole having a diameter larger than about 0.8 μm, and if the contact hole has a smaller diameter than 0.8 μm, it requires further complicated process such as deposition of a Ti film on the TiN film prior to the deposition of the aluminum alloy metal to increase the ability of the aluminum alloy film to flow into the contact hole. In this manner, this known method requires a rather complicated process and could not be applied actually.

SUMMARY OF THE INVENTION

The present invention has for its object to provide a novel and useful semiconductor device including a contact structure which can remove or mitigate the above mentioned drawbacks of the known contact structures.

It is another object of the invention to provide a novel and useful method of manufacturing a semiconductor device including a contact structure, which can be easily manufactured by merely flowing a raw material gas over a surface of a substrate during a selective Al CVD process.

According to a first aspect of the invention, a semiconductor device with a contact structure comprises:
 a semiconductor substrate having a surface;
 at least one of junction and gate insulating film formed on said surface of the semiconductor substrate;
 a conductive region formed on said at least one of junction and gate insulating
 an insulating film formed on said conductive region;
 a contact hole formed in said insulating film, an area of said contact hole being not larger than 0.7 $\mu m^2$;
 a plug formed in said contact hole and containing aluminum;
 a silicide film of high melting point metal formed at least at a bottom portion of said plug; and
 a metal wiring formed on said insulating film such that the metal wiring is electrically connected to said conductive region by means of said plug and silicide film, said metal wiring containing aluminum.

According to a second aspect of the invention, a semiconductor device with a contact structure comprises:
 a semiconductor substrate having a surface;
 at least one of junction and gate insulating film formed on said surface of the semiconductor substrate;
 a conductive region formed on said at least one of junction and gate insulating film;
 an insulating film formed on said conductive region;
 a contact hole formed in said insulating film;
 a plug formed in said contact hole and containing aluminum;
 a silicide film of high melting point metal formed at least at a bottom of said contact hole;
 an anti-diffusion film formed at least on said silicide film at the bottom of the contact hole; and
 a metal wiring formed on said insulating film such that the metal wiring is electrically connected to said conductive region by means of said plug, anti-diffusion film and silicide film, said metal wiring containing aluminum.

Said conductive region may be formed by a diffusion region formed on the surface of the semiconductor substrate or a gate electrode of MOSFET. In this case, the gate electrode may be formed by highly doped poly-silicon film, a stack of a highly doped polysilicon film and a metal silicide film such as $WSi_x$ and $TiSi_x$, a metal silicide and metal such as tungsten.

A method of manufacturing a semiconductor device with a contact structure according to the invention comprises the steps of:
 preparing a semiconductor substrate which has a surface;
 forming a conductive region on at least one of junction and gate insulating film on said surface of the semiconductor substrate;
 forming an insulating film on said conductive region;
 forming a contact hole having an area not larger than 0.7 $\mu m^2$ in said insulating film;
 forming a silicide film of high melting point metal at least at a bottom of said contact hole prior to the step of forming the insulating film and/or after the step of forming the contact hole;
 forming a plug containing aluminum in said contact hole by depositing a metal containing aluminum by a chemical vapor deposition using an organic aluminum compound gas; and forming a metal wiring containing aluminum on said insulating film such that the metal wiring is electrically connected to said conductive region by means of said plug and silicide film.

According to further aspect of the invention, a method of manufacturing a semiconductor device with a contact structure comprises the steps of:

preparing a semiconductor substrate which has a surface;

forming a conductive region on at least one of junction and gate insulating film formed on said surface of the semiconductor substrate;

forming an insulating film on said conductive region;

forming a contact hole in said insulating film;

forming a silicide film of high melting point metal at least at a bottom of said contact hole prior to the step of forming the insulating film and/or after the step of forming the contact hole;

forming an anti-diffusion film at least on said silicide film at the bottom of the contact hole prior to the step of forming the insulating film or after the step of forming the contact hole;

forming a plug containing aluminum in said contact hole by depositing a metal containing aluminum by a chemical vapor deposition using an organic aluminum compound gas; and forming a metal wiring containing aluminum on said insulating film such that the metal wiring is electrically connected to said conductive region by means of said plug, anti-diffusion film and silicide film.

According to the invention, said anti-diffusion film may be formed prior to or after the formation of the contact hole. In a preferable embodiment of the method according to the invention, said anti-diffusion film is simply formed by nitriding the silicide film via the contact hole.

In case of practically manufacturing the semiconductor devices, there are formed a plurality contact holes in a single insulating film, and in some cases these contact holes have different depths. According to the invention, even in such a case, it is possible to form plugs having excellent property. That is to say, according to the invention, after forming a plurality of contact holes having different depths in the insulating film, the selective Al CVD process for forming plugs containing aluminum is carried out for such a time period that the deepest contact hole is completely filled with a plug. Then, at shallow contact holes, plugs protrude from the surface of the insulating film. According to the invention, portions of plugs which protrude from the surface of the insulating film are removed by chemical mechanical polishing (CMP) to obtain a flat surface.

According to further aspect of the invention, a method of manufacturing a semiconductor device with a contact structure comprises the steps of:

preparing a semiconductor substrate which has a surface;

forming a conductive region on said surface of the semiconductor substrate;

forming an insulating film on said conductive region;

forming a contact hole in said insulating film;

performing a nitriding treatment to terminate dangling bonds on the surface of the insulating film by heating the surface of the semiconductor substrate in a nitriding atmosphere; and forming a plug containing aluminum in said contact hole by depositing a metal containing aluminum by a selective chemical vapor deposition using an organic aluminum compound gas.

BRIEF DESCRIPTION OF THE DRAWINGS

FIGS. 1A to 1D are cross sectional views showing successive steps of a known method of manufacturing the semiconductor device with a contact structure;

FIG. 2 is a cross sectional view illustrating a known contact structure;

FIGS. 3A and 3B are cross sectional and plan views depicting a contact structure used in an experiment for providing the function of the invention;

FIGS. 4A to 4D are cross sectional views illustrating successive steps of a first embodiment of the method according to the invention;

FIGS. 7A to 7D are cross sectional views depicting successive steps of a second embodiment of the method according to the invention;

FIGS. 8A to 8D are cross sectional views illustrating successive steps of a third embodiment of the method according to the invention;

FIGS. 9A to 9G are cross sectional views showing successive steps of a fourth embodiment of the method according to the invention;

FIG. 10 is a graph representing a relationship between a thickness of $TiSi_2$ film and leak current;

FIG. 11 is a diagram depicting an improvement of the nuclear generation density;

FIGS. 12A to 12G are cross sectional views showing successive steps of a fifth embodiment of the method according to the invention;

FIGS. 13A to 13C are cross sectional views illustrating steps of a sixth embodiment of the method according to the invention;

FIGS. 14, 15 and 16 are cross sectional views depicting three embodiments of the contact structure according to the invention;

FIGS. 17A to 17F are cross sectional views illustrating successive steps of a seventh embodiment of the method according to the invention;

FIGS. 18A to 18E are cross sectional views depicting successive steps of an eighth embodiment of the method according to the invention;

FIGS. 19A to 19E are cross sectional views showing successive steps of a ninth embodiment of the method according to the invention.

DESCRIPTION OF THE PREFERRED EMBODIMENT

Figure 5:
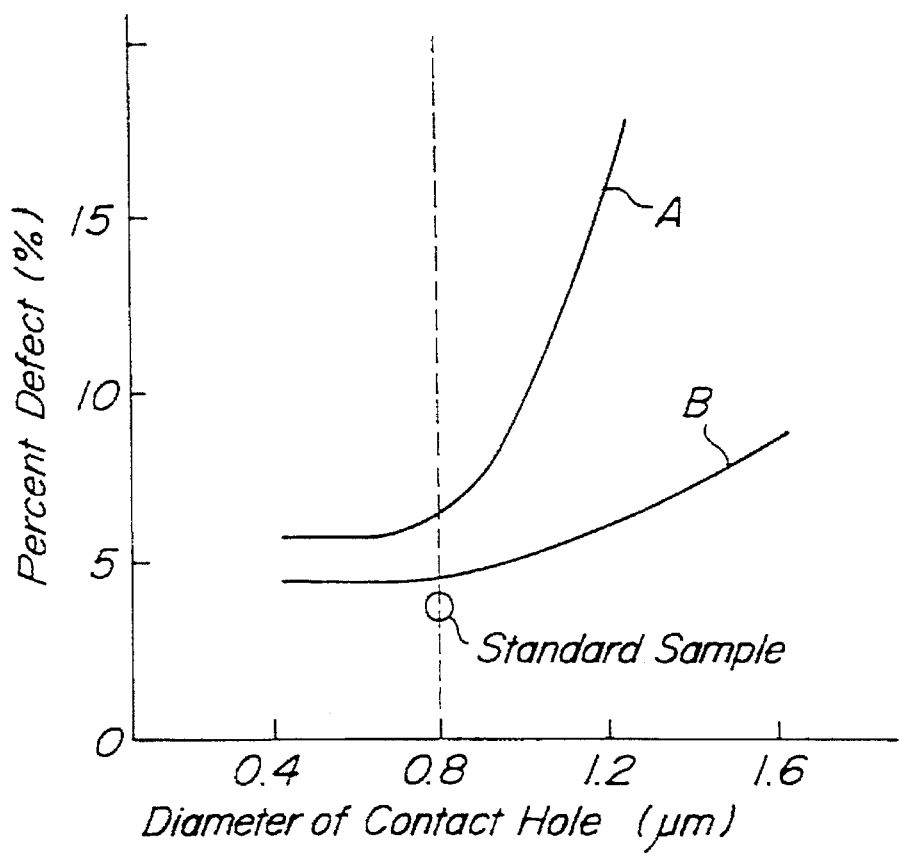
FIG. 5 is a graph representing the relationship between the diameter of the contact hole and the percent defect.

FIGS. 4A to 4D are cross sectional views showing successive steps of a first embodiment of the method of manufacturing the semiconductor device having a contact structure for connecting a drain region of MOSFET to a metal wiring. The semiconductor device comprises a P type silicon substrate 21 having a surface in which a field oxide film 22 is formed for isolating a transistor formed in a P type well 23 from adjacent wells. The field effect transistor comprises a gate oxide film 24 on which a gate electrode 25 made of polysilicon is formed. After forming a side wall 26, arsenic (As) is diffused into the P type well 23 to form N+ source and drain regions 27 and 28. In this process, As is also diffused into the poly-silicon gate electrode 25. A depth of junctions between the source and drain regions 27 and 28 and the P well 23 is about 0.12 μm. Next, silicide films TiSi$_2$ 29a–29c are formed on entire upper surfaces of the poly-silicon gate 25 and the source and drain regions by means of a known Ti salicide process. These silicide films 29a–29c have a thickness of about 70 nm.

Then, an interlayer insulating film 30 made of silicon oxide SiO$_2$ is formed on the surface of the silicon substrate 21. This interlayer insulating film 30 has a thickness of about 1 μm. Then, a photoresist (not shown) is formed on the insulating film 30 and is patterned by photolithography technique. Next, the insulating film 30 is selectively removed to form a contact hole 31 with a diameter of 0.5 μm by the reactive ion etching (RIE) while the photoresist is used as a mask as illustrated in FIG. 4B. At a bottom of the contact hole 31, the silicide film of high melting point metal 29c is exposed. After removing the photoresist, a dimethylaluminumhydride (DMAH) gas is flowed over the surface of the silicon substrate and an aluminum plug 32 is selectively deposited in the contact hole 31 as shown in FIG. 4C. It was found that the plug 23 is formed by a single aluminum grain.

According to the invention, instead of DMAH, it is also possible to use other organic aluminum compounds such as trimethylamine alane, dimethylethylamine alane, triethylamine alane, triisobutylaluminum, trimethylaluminum and an intermolecular compound of DMAH and trimethylaluminum.

Moreover, by supplying a gas containing copper such as cyclopentadienyl-triethylphosphine copper in addition to DMAH, it is possible to deposit an aluminum-copper alloy. Further, it is also possible to selectively deposit an aluminum alloy such as Al—Ti, Al—Si and Al—Sc by supplying a gas containing impurity elements which improve a quality of the aluminum film.

Next, on the substrate 21 having the plug 32 there is formed a Al—Cu alloy film having a thickness of 0.8 μm and then the Al—Cu film is patterned by RIE into a metal wiring 33 such that the Al—Cu alloy metal wiring 33 is electrically connected to the drain region 28 by means of the aluminum plug 32 and silicide film 29c as shown in FIG. 4D. Finally, in order to stabilize the transistor property, the substrate 21 is heated at 450° C. for thirty minutes under a mixture of nitrogen and hydrogen. Then, characteristics of the contact structure were measured.

In the present embodiment, the plug 32 can be formed in the contact hole 31 only by the selective CVD process in which the DMAH gas is flowed over the substrate surface. Therefore, it is no longer necessary to deposit the metal adhering film of Ti/TiN over the whole surface of the substrate and then the tungsten film is formed over the whole surface of Ti/TiN film and then the tungsten film is etched back. According to the invention, such a complicated process is not required and the plug can be formed very simply.

Figure 6A:
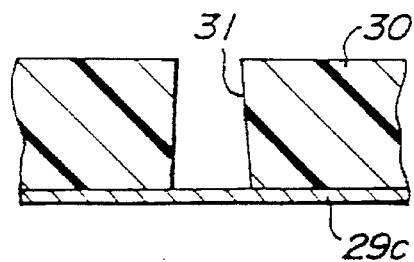
FIGS. 6A and 6B are cross sectional views showing different shapes of the contact hole.
Figure 6B:
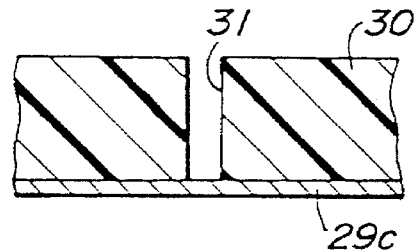

Further, in the present embodiment, it is possible to form the plug 32 within the contact hole 31 in regardless of a shape of the contact hole. That is to say, even when the contact hole 31 has a reversely tapered shape as depicted in FIG. 6A or a diameter of the contact hole is very small as illustrated in FIG. 6B, aluminum can be effectively deposited within the contact hole.

The inventors have conducted following experiments by using two kinds of samples in order to confirm the effectiveness of the present invention. In the first kinds of samples, a diameter of the contact holes were changed from 0.4 μm to 1.6 μm while the areas and the shapes of the diffusion layers and silicide films of high melting point metal were remained constant. It should be noted that a total area of the contact surfaces was kept constant by adjusting the number of the contact holes. In the second kind of samples, anti-diffusion film made of TiN and having a thickness of 100 nm was formed under the Al—Cu alloy film and no such an anti-diffusion film was formed between the plug and the silicide film. It should be noted that a ratio of the total contact surface area to an area of the metal wiring was set to be constant such as 1/50. Further, the mask pattern of the contact hole was designed to be rectangular and the contact holes having a size smaller than 0.8 μm had a substantially circular shape having a diameter not larger than 0.8 μm and the contact holes larger than 1.2 μm were substantially rectangular.

FIG. 5 shows a graph representing a relation between a percentage of contact deterioration and the size of the contact holes. Here, a vertical axis denotes a percent defective of samples whose contact was damaged or deteriorated among 412 samples. We also manufactured standard samples having tungsten plugs formed by depositing the tungsten film all over the substrate surface and having the contact size of 0.8 μm, and the contact damage was judged when a leak current became larger by thirty times than an average of leak currents of the standard samples. It should be noted that upon calculating the average of the leak currents, samples which showed leak currents larger by thirty times than the average value were removed. The percent defective of the standard samples was about 3% and was mainly due to the diffusion layer forming process and salicide formation process.

A curve A in FIG. 5 denotes the percent defective of the samples in which the anti-diffusion film was not formed, and a curve B illustrates that of the samples in which the anti-diffusion film was formed. As shown by the curve A, even if the anti-diffusion film is not formed, the percent defective is very small when the diameter of the contact hole is smaller than 0.8 μm. However, the percent defective increases abruptly when the diameter of contact hole becomes larger than 0.8 μm. This is due to the fact that when the contact hole has a diameter not larger than 0.8 μm, the plug is formed by a single aluminum grain as shown in FIG. 4C so that silicon and aluminum atoms could move only at a very low speed. On the other hand, when a diameter of contact hole exceeds 0.8 μm, the plug is formed by a plurality of aluminum grains as depicted in FIG. 3A, so that within the plug there are formed grain boundaries along which silicon atom can move easily. Therefore, after forming the plug 32, when the substrate is heated at a temperature above 350° C. in order to improve the transistor characteristics and to form an insulating film by CVD method on the metal wiring, silicon atoms are sucked from the diffusion layer 28 into the plug 32 via the silicide film 29c, because the silicon atoms can freely move within the silicide film and can move along the boundary of the aluminum grains of the plug 32. In this manner, silicon atoms move from the diffusion layer 28 into the plug 32 as shown by solid arrows in FIG. 3A and as the result thereof there are formed vacant sites within the diffusion layer 28 and aluminum atoms move from the plug 32 into the vacant sites as illustrated by broken arrows.

Particularly, when a metal wiring 33 made of aluminum or aluminum alloy is formed on the insulating film 11, a great amount of silicon atoms are sucked from the diffusion layer 28 along grain boundaries of aluminum grains forming the metal wiring 33 as depicted in a plan view of FIG. 3B. Therefore, within the P well 28, there are formed large vacant sites which penetrate in the bulk of the substrate beyond the diffusion layer and a large amount of aluminum atoms are intruded into the vacant sites. In this manner, there is formed a large spike 19 within the P well 28 and the junction leakage might occur.

In this manner, the contact property is deteriorated. It should be noted that in some samples having the contact holes smaller than 0.8 μm, the percent defective is slightly higher than that of the standard samples. Upon analyzing such defective samples, the plugs of some samples were formed by a plurality of aluminum grains. This is due to a fact that during the selective Al CVD, impurities remained on the surface of the $TiSi_2$ film and aluminum grains were formed while the impurities served as nucleation sites for the formation of grains. Therefore, if the substrate can be cleaned further, the percent defective would be reduced.

Figure 20:
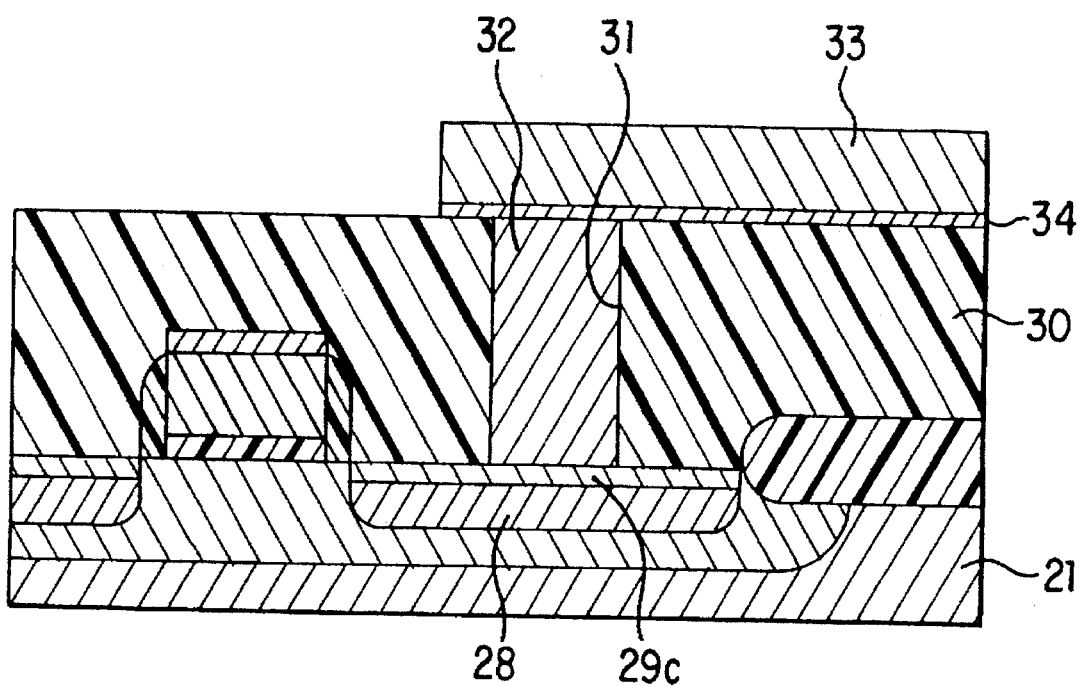
FIG. 20 is a cross sectional view of the contact structure having a diffusion barrier between the plug and the wiring layer.

As illustrated by the curve B, when the anti-diffusion film was formed under the Al—Cu alloy film, the percent defective is further reduced for the contact hole having a size not larger than 0.8 μm upon compared with the case in which no anti-diffusion film is formed. Even when the size of the contact hole becomes larger than 0.8 μm, the increase in the percent defective is smaller than the curve A. That is to say, when the anti-diffusion film is formed between the plug and the Al—CU metal wiring, as shown in FIG. 20, the movement of silicon and aluminum atoms is restricted to the diffusion region and plug, even if the aluminum grain boundary is formed in the plug, so that the large spike is not formed and the contact defect can be avoided.

The inventors further manufactured samples in which the plug is directly deposited on the diffusion region by the selective Al CVD. These samples had a percent defective higher than 90%. This is due to the fact that during the deposition of aluminum, aluminum atoms directly reacted with the diffusion region and very large spikes were formed.

From the above experiment, the inventors have found that the percent defective can be remarkably reduced by limiting the size of contact hole not larger than 0.8 μm, and the percent defective can be further reduced by forming the anti-diffusion film between the plug and the metal wiring.

By introducing silicon into the metal wiring by 0.7 weight percentage to form the metal wiring made of AlSiCu alloy, the percent defective of the samples having no anti-diffusion film could be reduced to such a level which is substantially equal to that of the samples comprising the anti-diffusion films. This value of 0.7 weight % exceeds the solid solution limit at 450° C., so that although the grain boundary is formed in the plug, aluminum and silicon atoms could not move from or into the AlSiCu metal wiring, so that large spikes are hardly formed and the contact defect does not occur. When silicon is added over the solid solution limit, however, silicon grains might be precipitated in the metal wiring and/or in the plug by the heating. In a semiconductor device having a fine structure, the silicon grain precipitated on the surface of the silicide film at the bottom of the contact hole might increase the contact resistance and deteriorate the reliability. Similarly, the percent defective of the samples comprising the anti-diffusion films could be further decreased by introducing silicon in the plug. Note that, in this case, only the silicon contained in the plug can be precipitated on the surface of the silicide film. So, the increase of the contact resistance is small. While, in the case of the samples having no anti-diffusion film with AlSiCu alloy metal wiring, all the silicon contained in the metal wiring of some tens of microns long can be precipitated on the surface of the silicide film, since silicon can move in aluminum very rapidly. So, the increase of the contact resistance might be very large.

In the above experiment, the square mask pattern was used for forming the contact holes, but according to the invention, it is also possible to use a rectangular mask. In this case, the percent defective is still remained small as long as an area of the contact hole is not larger than 0.7 μm², particularly $\pi \times (0.8/2)^2 = 0.5$ μm².

Furthermore, in the above experiment, $TiSi_2$ film formed by the salicide method was used as the silicide film of high melting point metal, but other materials may be equally used. For instance, after forming a $TiSi_x$ film by the sputtering on the whole surface of the substrate and then unnecessary portion is removed by etching, or $TiSi_x$ film may be formed only on the diffusion region and on the poly-silicon gate electrode by a selective CVD using a mixture of $TiCl_4$ and $SiH_4$. Note that the atom ratio of silicon to metal in silicide film formed by sputtering or CVD method cannot be controlled exactly. We denote such silicide as $MSi_x$ (M: metal). Further silicides of other high melting point metals such as $WSi_x$, $MoSi_x$ and $TaSi_x$ may be formed CVD or sputtering. However, use of $TiSi_2$ film formed by the salicide method is advantageous because the number of fabrication steps can be reduced. Further, $CoSi_2$, NiSi and PtSi films may be formed by the salicide method similar to $TiSi_2$ film. Use of these silicides including $TiSi_2$ is also advantageous for high speed logic integrated circuits because these silicides have smaller specific resistance compared with other silicides such as $WSi_x$, $TaSi_x$ and $MoSi_x$. Note that, since silicon and aluminum atoms move rapidly in these silicide films, contact structures of this invention is essential to make semiconductor devices with good electrical characteristics.

As the anti-diffusion film, use may be made of nitrides of high melting point metal such as TiN, WN, TaN, ZrN and HfN, oxide nitride of high melting point metal such as TiON and boride film of high melting point metal such as TiB. In the above embodiment, the contact structure is connected to the $N^+$ diffusion region, but according to the invention, it is also possible to form the contact structure connected to a $P^+$ diffusion region.

In the above embodiment, the silicide film is formed directly on diffusion region formed on the surface of the semiconductor substrate, but according to the invention, it is also possible to insert a polysilicon film or an epitaxially grown silicon film between the diffusion region and the silicide film. In this case, the epitaxially grown silicon film and the poly-silicon film should be highly doped to have the same conduction type as the diffusion region. In the above embodiment, the contact structure is formed to connect the metal wiring to the drain diffusion region of the MOSFET, but according to the invention, it is also possible to form contact structures for other devices. For example, the contact structure may be made to connect a metal wiring to an emitter diffusion region of a bipolar transistor.

FIGS. 7A to 7D are cross sectional views showing successive steps in a second embodiment of the method according to the invention for manufacturing the contact structure. In the present embodiment, portions similar to those of the first embodiment are denoted by the same reference numerals used in FIGS. 4A to 4D and their detailed explanation is dispensed with.

Similar to the first embodiment, a MOSFET is formed on the silicon substrate 21. The insulating film 30 is formed on the substrate 21 and the contact hole 31 is formed by RIE in the insulating film such that the silicide film 29c is exposed in the bottom of the contact hole 31 as shown in FIGS. 7A and 7B. Then, the substrate is subjected to a rapid thermal nitrization (RTN) process by heating the substrate at 800° C. for one minute in an atmosphere of ammonia gas so that a surface of the silicide film 29c exposed at the bottom of the contact hole 31 is selectively changed into a nitride film 35 made of TiN as depicted in FIG. 7C. Next, DMAH gas is flowed over the surface of the substrate to deposit aluminum selectively on the titanium nitride film 35 to form the plug 32 as illustrated in FIG. 7D. A metal wiring may be provided on the insulating film 30 such that it is connected to the plug 32.

In the second embodiment, the size of the contact hole 31 is not limited to being at most 0.8 μm, but a contact hole having any desired size may be used. That is to say, even if the plug 32 is formed by a plurality of aluminum grains including grain boundaries, the TiN film 35 formed between the silicide film 29c and the aluminum plug 32 serves as the anti-diffusion film so that the movement of silicon atoms within the silicon substrate 21 is inhibited by this film. Therefore, the formation of the spike within the well 23 can be effectively prevented. It has been experimentally confirmed that the percent defective of the contact structure of the second embodiment was very small and was compatible with that of the standard samples, so that the reliability of MOSFET was further improved.

In the above embodiment, the surface of the silicide film is nitrided to form an anti-diffusion film made of nitride of high melting point metal, but according to the invention, it is also possible to form an anti-diffusion film made of other materials. For example, the surface of the silicide film could be borided to form an anti-diffusion film made of boride of high melting point metal by boriding in an atmosphere of boron containing gas, such as $B_2H_6$.

FIGS. 8A to 8D are cross sectional views illustrating successive steps of a third embodiment of the method according to the invention for manufacturing the contact structure. Also in this embodiment, portions similar to those of the previous embodiments are denoted by the same reference numerals used in the previous embodiments. In the present embodiment, after forming the source and drain regions 27 and 28 in the silicon substrate 21 as shown in FIG. 8A, the insulating film 30 is formed on the substrate 21 as illustrated in FIG. 8B without forming the silicide film on the source and drain regions. Then, the contact hole 31 is formed in the insulating film 30 to expose the drain diffusion region 28 at a bottom of the contact hole 31. Next, a mixture of $TiCl_4$ and $SiH_4$ is flowed over the substrate 21 which is heated to 750° C. to deposit a silicide film 37 made of $TiSi_x$ selectively on the exposed surface of the drain diffusion region 28. The silicide film 37 has a thickness of about 100 nm. Then, the substrate 21 is subjected to the RTN process to change a surface of the silicide film 37 into a titanium nitride film 38 as shown in FIG. 8C. Next, a DMAH gas is flowed over the substrate surface and the aluminum plug 32 is formed in the contact hole by the selective Al CVD as illustrated in FIG. 8D.

In the third embodiment, it is possible to attain similar advantages to those of the second embodiment. That is, the TiN film 38 between the drain region 28 and the aluminum plug 32 serves as the anti-diffusion film, so that the movement of silicon atoms from the drain region into the plug or the metal wiring can be effectively prevented in regardless to the size of the contact hole 31.

In the second embodiment, the thickness of the nitride film 35 is restricted by a thickness of the silicide film of high melting point metal 29c. When the transistor has been miniaturized, a thickness of the diffusion region has become also thinner, so that a thickness of the silicide film has become also thin. Therefore, the second embodiment could not be applied to the highly miniaturized transistors. In the third embodiment, the silicide film 37 of high melting point metal can be formed in regardless to the size of transistor, and thus the third embodiment could be effectively applied to the highly miniaturized transistor.

In the third embodiment, the silicide film 37 is formed only on the exposed surface of the drain diffusion regions 28, but according to the invention, it is also possible to form the silicide film all over the surface of the diffusion region by the salicide method and then the insulating film my be deposited and the contact hole may be formed to expose a part of the silicide film, and then $TiSi_x$ may be selectively deposited on the exposed surface of the silicide film of high melting point metal. In this modification, the resistance of the source and drain regions can be reduced so that a high speed operation can be attained. In a further modification of this alternation, the silicide film may be locally formed on the diffusion region, and then the $TiSi_x$ may be selectively deposited on the exposed surface of the silicide film after forming the insulating film and contact hole. In these cases, the silicide film on the diffusion region may be formed by a silicide other than $TiSi_x$, such as $CoSi_x$. Also in these cases, the thickness of the $TiSi_x$ film deposited in the contact hole may be reduced so that all of the deposited $TiSi_x$ film is changed into the TiN film.

In the third embodiment, after forming the anti-diffusion film by nitriding $TiSi_x$ film selectively deposited in the contact hole, the plug is formed by the selective Al CVD. However, when the contact hole has a size not larger than 0.8 μm, it is not always necessary to form the anti-diffusion film like as the first embodiment. Even in such a case, it is possible to obtain the contact structure having the good contact property.

In the above explained second and third embodiments of the method according to the invention, the silicide film of high melting point metal is subjected to the nitriding process to form the anti-diffusion film. Now several embodiments of this nitriding process will be explained.

FIGS. 9A to 9G are cross sections showing successive steps of a fourth embodiment of the method of manufacturing the semiconductor device according to the invention. Also in the present embodiment, the contact structure serves to connect the drain diffusion region of the FET to the metal wiring.

As shown in FIG. 9A, in a surface of a silicon substrate 41 there is formed a P well 43 and on the surface of the silicon substrate there is formed a field oxide film 42 for isolating electronic elements. On the surface of the silicon substrate 41, there are further formed a gate insulating film 44 made of silicon oxide and gate electrode 45 made of poly-silicon. After forming a side wall 46 on a side surface of the gate electrode 45, arsenic impurities are diffused into the well 43 to form $N^+$ source and drain regions 47 and 48. A depth of junctions between these diffusion regions and the well is about 0.15 μm. Then, on the poly-silicon gate electrode 45, source and drain regions 47 and 48 there is formed a titanium silicide film 49 by a well known titanium salicide process as illustrated in FIG. 9B. A thickness of the titanium silicide film 49 is about 75 nm.

Next, as shown in FIG. 9C, on the surface of the substrate, there is formed a $SiO_2$ insulating film 50 having a thickness of 1.2 μm, and then a contact hole 51 is formed in the insulating film 50 by means of a well known photoetching process using photoresist as shown in FIG. 9D. It should be noted that the titanium silicide film 49 is exposed at a bottom of the contact hole 51.

After removing the photoresist, the substrate 41 is placed into a vacuum chamber and the exposed surface of the titanium silicide film 49 is subjected to the nitriding process to form a titanium nitride (TiN) film 52. In the present embodiment, the vacuum chamber is kept at a pressure of 50 torr and the substrate is rapidly heated to 700° C. for one minute in an atmosphere of monomethylhydrazine. The thus formed titanium nitride film 52 has a thickness of 5 nm or more, and this thickness is sufficient for suppressing the reaction of the titanium silicide with aluminum. That it to say, the titanium nitride film 52 effectively functions as the anti-diffusion film.

After performing the nitriding process explained above, the substrate is introduced into a vacuum chamber for forming the aluminum film. In this chamber, the DMAH gas is flowed over the surface of the substrate 41 and an aluminum plug 53 is selectively deposited in the contact hole 51 by the aluminum selective CVD as depicted in FIG. 9F. Next, on the insulating film 50 there is formed an Al—CU alloy film having a thickness of 0.9 μm such that the Al—Cu alloy film is connected to the aluminum plug 53, and then the Al—Cu alloy film is patterned to form an Al—Cu alloy wiring 54 as shown in FIG. 9G. After heating in hydrogen at 450° C. for 30 minutes, the contact property is measured.

In the present embodiment, the nitriding process is carried out by using the monomethylhydrazine, but according to the invention, the titanium silicide may be changed into the titanium nitride by using other nitrogen containing gases such as ammonia, hydrazine and alkylhydrazine. It has been experimentally confirmed that it is possible to obtain the good result by rapidly heating the substrate in an atmosphere containing ammonia to a temperature within a range from 800° C. to 900° C. for a time not longer than 60 seconds under a reduced pressure of 50 torr. Particularly when the substrate is heated to a temperature above 850° C., it is possible to form the nitride film which can effectively serve as the anti-diffusion film, and thus the reaction between the titanium silicide and aluminum can be effectively prevented. Furthermore, when a high frequency plasma is generated by nitrogen or ammonia, a similar excellent effect could be attained by heating the substrate at a lower temperature within a range from 300° C. to 450° C.

In this case, the vacuum chamber was kept at a pressure ranging from 1 to 100 torr. It has been further confirmed that a thickness of the TiN film can be adjusted by controlling the heating temperature and time, and when a thickness of TiN film is not less than 2 nm, preferably not less than 5 nm, it is possible to obtain the sufficient anti-diffusion effect. In this case, it is sufficient for forming the titanium silicide film with a thickness not less than 25 nm. Therefore, the above thickness is sufficient for preventing the diffusion of aluminum.

In the above embodiment, the surface of the silicide film exposed at the bottom of the contact hole is changed into a nitride film after the formation of insulating film and contact hole, but according to the invention, it is also possible to change the surface of the silicide film before the formation of insulating film and contact hole. In this case, however, the nitriding condition should be modified to increase the thickness of the nitride film, because some of the nitride film would be etched during the dry etching process used to form contact hole. Moreover, the resistance of drain and source regions would be increased because the thickness of the silicide film between the contact and channel region of the MOSFET would be decreased due to the nitriding treatment.

FIG. 10 is a graph showing a relationship between a thickness of the $TiSi_2$ film and a contact leak current, while a thickness of the TiN film is taken as a parameter. From FIG. 10, it can be understood that the contact leak current is greatly dependent upon the thickness of the TiN film and $TiSi_2$ film. When the TiN film is not formed, there is produced a rather large contact leak current, but when the TiN film is formed, the contact leak current can be reduced even if the film is very thin. Particularly, when the TiN film having a thickness larger than 2 nm is formed, the contact leak current can be reduced remarkably by forming the $TiSi_2$ film having a thickness larger than 25 nm. It should be noted that the maximum thickness of the TiN film depends upon the thickness of the $TiSi_2$ film, and generally the maximum thickness of the TiN film is about 50 nm.

FIG. 11 is a graph representing the number of aluminum nucleation sites generated during CVD of Al by a breakage of the selectivity on the insulating film in cases of no treatment, treatments with hydrazine, ammonia and plasma ammonia. It has been confirmed that the breakage of selectivity could be substantially completely avoided by the nitriding treatment. It is considered that the dangling bonds existed on the surface of the insulating film are terminated by the nitriding treatment. However, an amount of oxygen during the nitriding treatment has to be smaller than 1 ppm, because when the oxygen amount exceeds 1 ppm, the generation of aluminum nuclears is increased.

FIGS. 12A to 12G are cross sectional views illustrating successive steps of a fifth embodiment of the method according to the invention. Steps shown in FIGS. 12A and 12B are entirely same as those of the third embodiment depicted in FIGS. 8A and 8B, so that portions Similar to those of the fourth embodiment are denoted by the same reference numerals. In the present embodiment, after forming the contact hole 51 in the insulating film 50 and removing the photoresist, the substrate is introduced into the vacuum chamber and a Ti film 60 having a thickness of 100 nm is formed on the surface of the substrate by a collimator sputtering method as shown in FIG. 12C. Next, the substrate is heated at 800° C. for thirty seconds in an atmosphere of nitrogen, and then unreacted titanium is removed with the aid of a mixture of sulfuric acid and hydrogen peroxide solution. In this manner, a titanium silicide film 61 is formed at a bottom of the contact hole 51 as depicted in FIG. 12D.

Then, the substrate 41 is introduced into the vacuum chamber and is rapidly heated under the existence of monomethylhydrazine gas at 10 torrs. During this heating, the titanium silicide film 61 is nitrided to form a titanium nitride film 62 as illustrated in FIG. 12E. The nitriding treatment is carried out at 700° C. for one minute under the pressure of 10 torrs, then the TiN film 62 having a thickness more than 5 nm can be formed. This thickness is sufficient for preventing the reaction between the titanium silicide and the aluminum.

Next the substrate is introduced into a vacuum chamber and the DMAH gas is flowed over the surface of the substrate to form the aluminum plug 53 in the contact hole 51 as shown in FIG. 12F by the selective CVD using an organic aluminum compound gas. Then, an Al—Cu alloy film having a thickness of 0.9 μm is deposited on the insulating film 51, and then the alloy film is patterned into a metal wiring 54 which is connected to the drain region 48 by means of the aluminum plug 53, TiN film 62 and TiSi$_2$ film 61. After performing the hydrogen heating treatment at 450° C. for thirty minutes, the contact property was measured. Then, it was confirmed that the contact structure can provide an excellent property like as the fourth embodiment.

FIGS. 13A to 13D are cross sectional views showing successive steps of a sixth embodiment of the method according to the invention. In the present embodiment, the contact structure serves to connect upper and lower metal wirings via a plug formed in a contact hole provided in an interlayer insulating film. A lower metal wiring 73 comprises a TiN film 71 having a thickness of 50 nm and an Al—Cu film 72 having a thickness of 800 nm. On the lower metal wiring 71 there is formed an interlayer insulating film 74, and then a contact hole or via hole 75 is formed in the insulating film as shown in FIG. 13A. At a bottom of the contact hole 75, the TiN film 71 is exposed. Next, after removing a photoresist, the substrate is introduced into a vacuum chamber and is subjected to a surface treatment or nitriding treatment in an ammonia plasma. The surface treatment is carried out at 350° C. under a pressure of 0.5 torrs, while the ammonia gas is activated with 300 W RF power having a frequency of 13.56 MHz.

Next, the substrate is brought into a vacuum chamber for forming aluminum plug. In this vacuum chamber, a DMAH gas is flowed over the substrate and aluminum is selectively deposited in the contact hole 75 to form an aluminum plug 76 as shown in FIG. 13B. Then, an Al—Cu alloy film 77 having a thickness of 0.9 μm is deposited on the interlayer insulating film 74 as illustrated in FIG. 13D, and this Al—Cu alloy film is patterned to form an upper wiring which is connected to the lower metal wiring 71 by means of the aluminum plug 76. After performing the hydrogen heating treatment at 450° C. for 30 minutes, the contact property was measured. It has been found that the contact structure of the present embodiment also has a good property.

In the present embodiment, the nitriding process is carried out by using the activated ammonia plasma, but according to the invention, the nitriding treatment may be performed at 400° C. in an atmosphere of monomethylhydrazine. In this case, the TiN film exposed at the bottom of the contact hole 75 is not changed into the titanium nitride, but the surface of the interlayer insulating film 74 and an inner wall of the contact hole 75 are subjected to the nitriding treatment, so that the selectivity of the selective Al CVD process is improved. In the present specification, such a surface treatment is also called the nitriding treatment although the exposed surface of the TiN film 71 is not nitrided. It is also possible to use a titanium or a titanium silicide film as a substitute of the TiN film 71. In this case, surface of the titanium or titanium silicide film is changed into a titanium nitride.

In the embodiments so far explained, the contact structure is applied to the diffusion region formed in the surface of the silicon substrate, but the present invention may be used to form a connection to another conductive regions such as a gate electrode of MOSFET. FIGS. 14, 15 and 16 are cross sectional views at the center of the gate electrodes showing several embodiments of such modification.

In FIG. 14, a gate electrode 81 is formed by a highly doped poly-silicon and an insulating film 82 is applied on a surface of a silicon substrate 83. In the insulating film 82, there is formed a contact hole 84 at whose bottom there are formed silicide film 85 and nitride film 86 of high melting point metal, and a remaining space of the contact hole 84 is filled with an aluminum plug 87. On the insulating film 82, there is formed a metal wiring 88 containing aluminum and being connected to the plug 87. The contact structure of the present embodiment may be manufactured by a method similar to that shown in FIGS. 8A to 8D.

In an embodiment shown in FIG. 15, the gate electrode is formed by a highly doped poly-silicon film 81 and a silicide film 89 of high melting point metal is applied on the poly-silicon film 81. Therefore, at a bottom of the contact hole 84 formed in the insulating film 82, the silicide film 89 is exposed. Then, the nitriding treatment is performed to change the exposed surface of the silicide film 89 into a nitride film 90 of high melting point. After that, the aluminum plug 87 is formed in the contact hole 84 by the selective Al CVD. This method is similar to that illustrated in FIGS. 9A to 9G.

FIG. 16 shows still another embodiment, in which a gate electrode 91 is formed by a silicide film of high melting point metal such as WSi$_x$, MoSi$_x$ and TaSi$_x$. After forming the contact hole 84 in the insulating film 82, a TiSi$_x$ film is deposited selectively on the surface of the silicide film 91 exposed at the bottom of the contact hole, and then all of the deposited TiSi$_x$ film is changed to a TiN film 92. After that, an aluminum plug 87 is formed in the contact hole 84 by means of the selective Al CVD method.

In this embodiment, the silicide film itself is the conductive region on the gate insulating film. In the above embodiment, all of the TiSi$_x$ film deposited in the contact hole is changed to the TiN film, but according to the invention, it is also possible to remain the bottom portion of the TiSi$_x$ film unchanged.

Note that, as shown in FIGS. 14, 15 and 16, the contact holes are not formed above the gate insulating films but above the field oxide films. In recent MOS transistors, however, the contact holes are formed at the position very close to the gate insulating films to minimize the dimension of the devices. For example, the typical lateral distance from the edge of the field oxide and the center of the contact hole is 0.7 μm in the devices with 0.5 μm feature size. Aluminum atoms can move such a small distance in the silicide or polysilicon film in a very short time. So, the contact structures of this invention is essential to make semiconductor devices with good electrical characteristics.

In case of manufacturing an actual semiconductor device, a number of contact holes are simultaneously formed in the insulating film and are simultaneously filled with aluminum plugs by the selective Al CVD method. In such a case, the contact holes may nave different depths. Further, a surface of the insulating film is not planarized. In the method according to the present invention, even in such cases, the contact structures can be manufactured precisely and reliably. Now several embodiments of such a method will be explained.

FIGS. 17A to 17F are cross sectional views illustrating successive steps of a seventh embodiment of the method according to the invention. Note that a plane of drawings of FIGS. 17A to 17F is perpendicular to that of FIG. 15.

As shown in FIG. 17A, on a surface of a silicon substrate or wafer 101 there is formed a relatively thick field oxide film 102 for isolating elements from each other. At a gate of MOSFET there is formed a thin gate oxide film 103 and on which a poly-silicon film 104 is deposited and a side wall 105 made of silicon oxide is formed on a side surface of the poly-silicon film 104. Then, source and drain regions 106 and 107 are formed by a diffusion while the poly-silicon film 104 and side wall 105 are used as a mask for the ion implantation. In this manner, the source and drain regions can be formed in a self-alignment manner. It should be noted that a well-known lightly doped drain (LDD) structure may be formed. During the formation of the gate electrode 104 and side wall 105, there is also formed another gate electrode consisting of highly doped polysilicon film 108 and side wall 109 on the field oxide film 102. Note that, as can be seen from FIG. 15, the gate electrode 108 extends on the gate oxide film and the distance between the gate oxide film and the contact hole 115 is small. Then, on surfaces of the polysilicon films 104 and 108 as well as on surfaces of the source and drain regions 106 and 107 there are formed titanium silicide films 110, 111 and 112, 113 by a well known salicide method.

Then, on the surface of the silicon substrate 101, there is formed a silicon oxide film having a thickness of 100 nm by CVD and further a BPSG (borophosphosilicate glass) film having a thickness of 1300 nm are formed. Then, the substrate is heated at a temperature of 800° C. for thirty minutes to obtain an insulating film 114. Since the surface of the substrate has protrusions and depressions, the surface of the insulating film 114 is not flat. In order to flatten the surface of the insulating film 114, the surface is polished or etched by a well known chemical mechanical polishing (CMP) using a slurry containing KOH. During this CMP process, the thickness of the insulating film 114 on the source and drain regions is decreased to 1200 nm. This CMP has been described in U.S. Pat. No. 4,944,836. Next, by using well known photographic and dry etching techniques, contact holes 115 and 116 are formed in the insulating film 114 as shown in FIG. 17B. Since the insulating film 114 has a varying thickness, these contact holes 115 and 116 have different depths. That is, the contact hole on the gate electrode 115 is smaller than that on the diffusion region 116. At bottoms of the contact holes 115 and 116 there are exposed the titanium silicide films 111 and 113, respectively.

Then, the substrate is subjected to RTN process under an atmosphere of ammonia and the exposed surfaces of the titanium silicide films 110 to 113 at the bottoms of the contact holes 115 and 116 are changed into titanium nitride to form TiN films 117 and 118, respectively as illustrated in FIG. 17C. Then, by the selective Al CVD using DMAH gas, aluminum is selectively deposited on the TiN films 117 and 118 to form aluminum plugs 119 and 120 in the contact holes 115 and 116, respectively as shown in FIG. 17D. In the present embodiment, this selective Al CVD is carried out for such a time period that the deepest contact hole can be sufficiently filled with aluminum. Therefore, at a shallow contact hole, aluminum protrudes by about 0.4 μm over the surface of the insulating film 114. Then, the protruding aluminum 119 is removed by CMP using a slurry including $H_2O_2$ and $H_3PO_4$. This CMP method has been described in U.S. Pat. No. 5,209,816. In this manner, it is possible to obtain the aluminum plugs 119 and 120 having surfaces completely flushed with the surface of the insulating film 114 as depicted in FIG. 17E. Then, an aluminum alloy film is deposited on the insulating film 114 and then is patterned into a desired shape to form metal wirings, one of which 121 is connected to the gate electrode 108 by means of the plug 119 and the other 122 is connected to the drain region 107 by means of the plug 120.

In the present embodiment, after flattening the insulating film surface, the contact holes 115 and 116 are formed, but according to the invention, the contact holes may be formed prior to flattening the insulating film 114, the aluminum plugs 119 and 120 may be formed and then, the insulating film 114 may be flattened. In this case, contact holes have the same depth prior to the formation of the aluminum plugs, so that the selective Al CVD may be performed that all the contact holes are completely filled with aluminum. Then, the surface of the BPSG film 114 and aluminum plugs may be polished by CMP using a slurry containing acetic acid.

In some semiconductor devices, between a transistor and a metal wiring, there may be formed another wirings such as a highly doped poly-silicon wiring; polycide wiring formed with a stack of a highly doped poly-silicon film and a silicide film such as $WSi_x$ film, $MoSi_x$ film, $TaSi_x$ film and $TiSi_x$ film; silicide wiring formed with such as $WSi_x$ film, $MoSi_x$ film, $TaSi_x$ film and $TiSi_x$ film; metal compound wiring formed with such as TiN film; high melting point metal wiring formed with such as W film, Mo film and Ta film. The transistor, these wirings and the aluminum wirings are electrically isolated by insulating films in which contact holes are formed. These contact holes may be fully or partially filled with aluminum. In case forming an aluminum plug for connecting the aluminum wiring to other wiring, a depth of a contact hole becomes further shallow as compared with a contact hole for connecting a gate electrode and the aluminum wiring, so that the technique for polishing a top protruding portion of the aluminum plug is much more important.

FIGS. 18A to 18E are cross sectional views showing successive steps of an eighth embodiment of the method according to the invention. In this embodiment, portions similar to these of the previous embodiment are denoted by the same reference numerals used in FIGS. 17A to 17F and their detailed explanation is dispensed with.

Figure 18A:
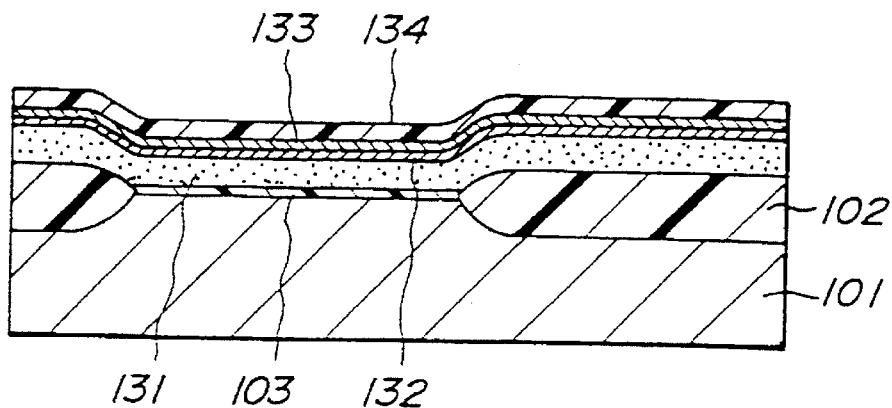

After forming field oxide film 102 and gate oxide film 103 on a silicon substrate 101, a poly-silicon film 131 having impurities doped therein and a thickness of 200 nm is deposited by CVD, and then Ti film 132 having a thickness of 30 nm and TiN film 133 having a thickness of 70 nm are successively applied by sputtering, and further a silicon oxide film 134 having a thickness of 100 nm is deposited by CVD as shown in FIG. 18A.

Figure 18B:
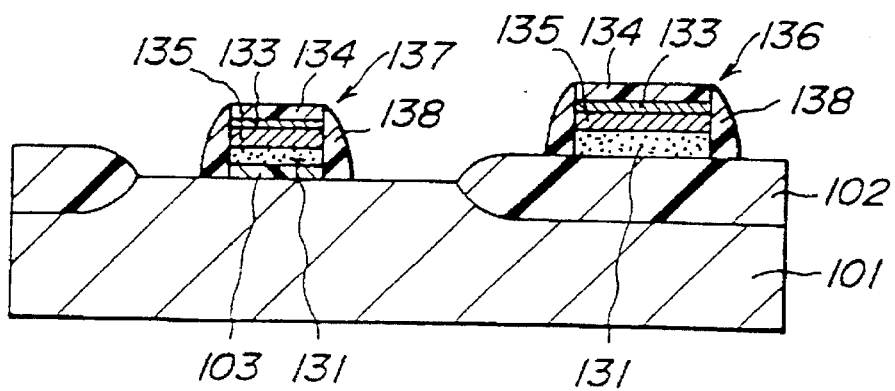

Then, the substrate is heated at a temperature of 750° C. for thirty seconds to react the Ti film 132 with the poly-silicon film 131 to form a $TiSi_2$ film 135 (see FIG. 18B). Then, a stack of the poly-silicon film 131, $TiSi_2$ film 135, TiN film 133 and $SiO_2$ film 134 is patterned by the photolithography and dry etching to form gate electrodes 136 and 137 as shown in FIG. 18B. In the present embodiment, the gate electrode 136 is formed on the surface of the field oxide film 102 and the gate electrode 137 is provided on the surface of the silicon substrate 101. After depositing a silicon oxide film on the substrate, side walls 138 are formed on side surfaces of the gate electrodes 136 and 137 by dry etching.

Figure 18C:
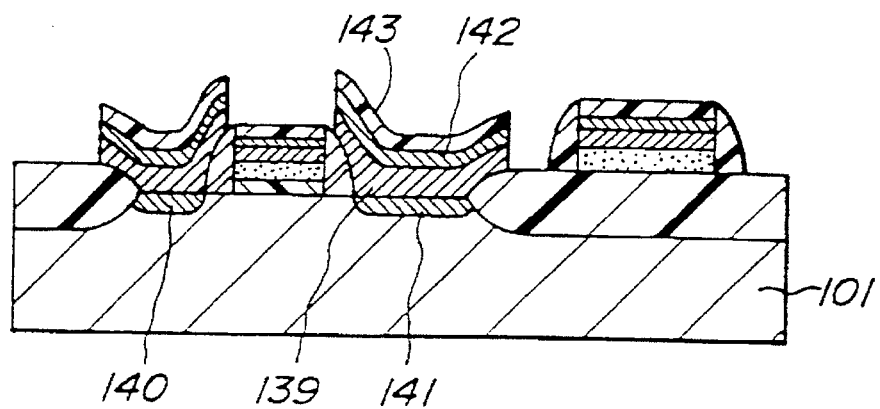

On a whole surface of the substrate, there is formed a $WSi_x$ (x=2.7) film 139 by sputtering, and after that dopants are introduced into the $WSi_x$ film by ion implantation. Next, TiN film 142 having a thickness of 70 nm is deposited on the $WSi_x$ film 139 by sputtering and then $SiO_2$ film 143 is deposited thereon by CVD. Then, a stack of the $WSi_x$ film 139, TiN film 142 and $SiO_2$ film 143 is patterned by the photolithography and dry etching, and further the substrate is heated at 850° C. for thirty minutes to diffuse the dopants into the silicon substrate 102 to form the source and drain regions 140 and 141 as shown in FIG. 18C. This method of forming the source and drain regions has been disclosed by C. T. Liu et al in "Technical Digest of 1993 International Electron Device Meeting", 1993 p. 93.

Next, an insulating film 114 is formed by CVD and CMP methods, and then contact holes 115 and 116 are formed in the insulating film as shown in FIG. 18D. This etching process is performed by using CHF$_3$ and CF$_4$ gases at a pressure of about 50 m torrs and the surfaces of the TiN films 133 and 142 are exposed at the bottoms of the contact holes 115 and 116, respectively. Then, DMAH is flowed over the surface of the substrate to selectively deposit aluminum plugs 119 and 120 in the contact holes 115 and 116, respectively. Finally, aluminum wirings 121 and 122 are formed on the insulating film 114 as illustrated in FIG. 18E.

In the present embodiment, the TiN film 133 serves to prevent the oxidation or nitrization of titanium during the heating process to react with the poly-silicon film, and these films may be formed by nitrides of high melting point metal such as WN, MoN, ZrN, HfN and TaN, oxide nitrides of high melting point metal such as TiON, borides of high melting point metal such as TiB and high melting point metal in Va and VIa groups of periodic table such as W, Mo, Nb and Ta.

The TiN film 142 on the WSi$_x$ film serves to prevent out-diffusion of dopants during the heating for forming the source and drain regions. In the present embodiment, TiN film serving as the anti-diffusion film is formed all over the TiSi$_2$ film. Moreover, it is possible to form the anti-diffusion film without performing processes which require high temperatures above 500° C. after forming the contact hole. Therefore, it is also possible to form simultaneously a contact structure for connecting a gate electrode or diffusion region to an upper metal wiring and a contact structure for connecting the lower and upper aluminum wirings.

In the embodiments so far explained, the contact structure for the diffusion region is formed just on the diffusion region, but according to the invention it is also possible to provide the contact structure for the diffusion region on the field oxide film. Such an embodiment will be explained with reference to FIGS. 19A to 19E.

As shown in FIG. 19A, after forming field oxide film 102 and gate oxide film 103 on a silicon substrate 102, a poly-silicon film 131 having impurities highly doped therein and a thickness of 200 nm is deposited by CVD, and then WSi$_x$ (x=2.7) film 151 having a thickness of 150 nm is provided by sputtering, and further a silicon oxide film 134 having a thickness of 100 nm is deposited by CVD.

Then, a stack of the poly-silicon film 131, WSi$_x$ film 151 and SiO$_2$ film 134 is patterned by the well known photolithography and dry etching to form gate electrode 136 on the field oxide film 102 and a gate electrode 137 on the silicon substrate 101 as illustrated in FIG. 19B. Then, side walls 138 made of silicon oxide are formed on side surfaces of the gate electrodes 136 and 137.

Next, Ti film and amorphous silicon film are deposited on the substrate by sputtering and dopants are implanted into the amorphous silicon film. Then, the amorphous silicon film is selectively removed by the photolithography and dry etching, and then the assembly is heated at 825° C. for thirty seconds to react the amorphous silicon with the Ti film to form a TiSi$_2$ film 152 having a thickness of 85 nm. Then, unreacted Ti film is removed by using a mixture of H$_2$SO$_4$ and H$_2$O$_2$. After that, the assembly is heated at 850° C. for thirty minutes to form source and drain regions 140 and 141 in the surface of silicon substrate 101 as depicted in FIG. 19C. This method of forming the source and drain regions 140 and 141 has been described by T. Yoshida et al in "Extended Abstracts of 1993 International Conference on Solid State Devices and Materials", 1993, P. 567. It should be noted that the patterning is carried out such that the TiSi$_2$ film 152 extends on to the field oxide film 102.

Next, an insulating film 114 having a flat surface is formed on the substrate, and then contact holes 115 and 116 are formed in the insulating film as shown in FIG. 19D. During this process, the surface of the TiSi$_2$ film 152 is exposed at the bottom of the contact hole 116. Then, the assembly is subjected to RTN process and the exposed surface of TiSi$_2$ film 152 is changed into a TiN film 153. Then, DMAH is flowed over the surface of the substrate to selectively deposit aluminum plugs 119 and 120 in the contact holes 115 and 116, respectively. Finally, aluminum wirings 121 and 122 are formed on the insulating film 114 as illustrated in FIG. 19E.

In the present embodiment, the aluminum plug 120 is formed at a position remote from the diffusion region 141, so that the deterioration Of the property due to the diffusion of the aluminum can be further reduced. However, if the TiN barrier film 153 is not formed at the bottom of the contact hole 116, aluminum atoms can be moved into the diffusion region 141 through the TiSi$_2$ film 152. Particularly, when the contact hole has an area larger than 0.7 µm$^2$, contact deterioration is remarkably detected.

We claim:

1. A method of manufacturing a semiconductor device having a contact structure, the contact structure comprising a conductive region formed on at least one of a junction formed in and a gate insulating film formed over a surface of a semiconductor substrate, a silicide film of high melting point metal formed on at least a portion of the conductive region, the method comprising the steps of:

forming an insulating film over the conductive region, the insulating film having a contact hole;

forming an anti-diffusion film by nitriding at least a portion of the surface of the silicide film in a nitriding atmosphere; and forming a plug containing aluminum in the contact hole by selective chemical vapor deposition such that a lower end of the plug contacts the anti-diffusion film.

2. A method according to claim 1, further comprising the step of forming the silicide film of high melting point metal prior to the step of forming the insulating film.

3. A method according to claim 1, wherein said high melting point metal of the silicide film is Ti.

4. A method according to claim 3, wherein said step of forming the anti-diffusion film is performed such that the thickness of the anti-diffusion film within a range from 2 nm to 50 nm.

5. A method according to claim 3, wherein said step of forming the anti-diffusion film is performed by using an atmosphere containing ammonia gas at a temperature within a range from 800° C. to 900° C. for a time not longer than 60 seconds.

6. A method according to claim 1, wherein the step of forming the insulating film having the contact hole is performed prior to the step of forming the anti-diffusion film such that a surface of the insulating film is simultaneously nitrided with the silicide film during the step of forming the anti-diffusion film.

7. A method according to claim 6, wherein, when the plug is formed by the selective chemical vapor deposition, substantially no aluminum is deposited on the insulating film.

8. A method according to claim 6, wherein the step of forming the plug comprises growing the plug solely from the anti-diffusion film.

9. A method according to claim 6, wherein the step of forming the plug comprises depositing substantially no aluminum on side walls of the contact hole.

10. A method according to claim 1, wherein the step of forming the insulating film having the contact hole is performed prior to the step of forming the anti-diffusion film.

11. A method according to claim 10, wherein said high melting point metal of the silicide film is titanium.

12. A method according to claim 1, wherein said step of forming the insulating film forms an insulating film having at least two contact holes having different depths; and said step of forming the plug further comprises the steps of:

forming at least two plugs in said contact holes such that the deepest contact hole is filled with a corresponding one of the at least two plugs, and removing a part of each plug which protrudes from the surface of the insulating film.

13. A method of manufacturing a semiconductor device having a contact structure, the contact structure comprising a conductive region formed on at least one of a junction formed in a surface of a semiconductor substrate and a gate insulating film formed over a surface of a semiconductor substrate, a silicide film of high melting point metal formed on at least a portion of the conductive region, the method comprising the steps of:

forming an insulating film over the conductive region, the insulating film having a contact hole;

forming an anti-diffusion film by nitriding at least a portion of the surface of the silicide film in a nitriding atmosphere; and forming a plug containing aluminum in the contact hole by selective chemical vapor deposition such that a lower end of the plug contacts the anti-diffusion film, wherein, when the plug is formed by the selective chemical vapor deposition, the selectivity of the chemical vapor deposition on the anti-diffusion film is enhanced relative to an anti-diffusion film formed other than by nitriding the silicide film.

14. A method according to claim 13, further comprising the step of selectively forming the silicide film of high melting point metal in said contact hole.

15. A method according to claim 14, wherein said silicide film of high melting point metal is $TiSi_x$, and said step of selectively forming the silicide film is performed by a chemical vapor deposition using $TiCl_4$ gas and $SiH_4$ gas.

16. A method according to claim 14, further comprising the step of forming a second silicide film of high melting point metal prior to the step of forming the insulating film.

17. A method according to claim 16, wherein said silicide film of high melting point metal formed selectively in the contact hole is $TiSi_x$, and is deposited by selective chemical vapor deposition using $TiCl_4$ gas and $SiH_4$ gas.

18. A method according to claim 14, wherein said step of forming the silicide film of high melting point metal comprises the steps of:

forming a film of the high melting point metal at least on the conductive region exposed at the bottom of the contact hole;

forming the silicide film by reacting the film of the high melting point metal and the conductive region; and removing an unreacted portion of the film of the high melting point metal such that the silicide film remains on the bottom of the contact hole.

19. A method according to claim 18, wherein said high melting point metal is titanium.

20. A method according to claim 13, wherein said high melting point metal of the silicide film is titanium.

21. A method according to claim 20, wherein the step of forming the anti-diffusion film is performed such that a thickness of the anti-diffusion film is within a range from 2 nm to 50 nm.

22. A method according to claim 20, wherein the step of forming the anti-diffusion film comprises forming the anti-diffusion film using an ambient atmosphere containing ammonia gas at a temperature within a range from 800° C. to 900° C. for a time not longer than sixty seconds.

23. A method according to claim 13, wherein the step of forming the plug comprises growing the plug solely from the anti-diffusion film.

24. A method according to claim 23, wherein said high melting point metal of the silicide film is titanium.

25. A method according to claim 13, wherein the step of forming the plug comprises depositing substantially no aluminum on side walls of the contact hole.

* * * * *